United States Patent [19]

Muramoto et al.

[11] Patent Number: 5,759,743
[45] Date of Patent: Jun. 2, 1998

[54] DEVELOPER-CIRCULATING METHOD IN FLEXOGRAPHIC PRINTING PLATE-MAKING PROCESS AND APPARATUS FOR CARRYING OUT DEVELOPER-CIRCULATING METHOD

[75] Inventors: Hisaichi Muramoto, Hirakata; Yasushi Umeda, Kusatsu, both of Japan

[73] Assignee: Nippon Paint Co., Ltd., Osaka, Japan

[21] Appl. No.: 613,539

[22] Filed: Mar. 11, 1996

Related U.S. Application Data

[63] Continuation of Ser. No. 256,260, filed as PCT/JP93/01547 Oct. 27, 1993, abandoned.

[30] Foreign Application Priority Data

Oct. 30, 1992 [JP] Japan .................................. 4-292624
Dec. 11, 1992 [JP] Japan .................................. 4-331508

[51] Int. Cl.⁶ .................................................. G03F 7/00
[52] U.S. Cl. .................. 430/309; 430/331; 430/399; 396/565; 396/626; 210/724; 210/725; 210/454
[58] Field of Search .............................. 430/309, 306, 430/286.1, 270.1, 331, 399; 210/724, 725; 396/565, 626

[56] References Cited

U.S. PATENT DOCUMENTS

| | | | |
|---|---|---|---|
| 4,239,368 | 12/1980 | Krause et al. | 354/325 |
| 4,251,374 | 2/1981 | Cunningham | 210/454 |
| 4,284,507 | 8/1981 | Beane | 210/323.2 |
| 4,517,282 | 5/1985 | Tomisawa et al. | 430/399 |
| 4,593,986 | 6/1986 | Tomisawa et al. | 354/324 |
| 4,796,042 | 1/1989 | Mappin et al. | 354/324 |
| 4,841,749 | 6/1989 | Cox | 210/786 |
| 4,961,859 | 10/1990 | Uehara et al. | 210/725 |
| 5,055,870 | 10/1991 | Ohba et al. | 354/317 |
| 5,344,744 | 9/1994 | Ueda et al. | 430/287 |

FOREIGN PATENT DOCUMENTS

| | | |
|---|---|---|
| 0 430 233 | 6/1991 | European Pat. Off. . |
| 31 02 125 | 8/1982 | Germany . |
| 33 28 264 | 2/1984 | Germany . |
| 58-65433 | 4/1983 | Japan . |
| 64-10247 | 2/1989 | Japan . |
| 1-300246 | 12/1989 | Japan . |
| 1-304462 | 12/1989 | Japan . |
| 2-220061 | 9/1990 | Japan . |
| 3-41453 | 2/1991 | Japan . |
| 3-66004 | 10/1991 | Japan . |
| 4-14342 | 3/1992 | Japan . |
| 5-150451 | 6/1993 | Japan . |

OTHER PUBLICATIONS

Perry's Chemical Engineers' Handbook, Sixth Edition, 1984, edited by Don Green, pp. 19–74 to 19–82, pp. 19–86, pp. 19–107 to 19–109.

Patent Abstracts of Japan, vol. 12, No. 191 (C–501), 3 Jun. 1988.

*Primary Examiner*—George F. Lesmes
*Assistant Examiner*—Laura Weiner
*Attorney, Agent, or Firm*—Wenderoth, Lind & Ponack

[57] ABSTRACT

It is an object of the present invention to provide a developer-circulating method and an apparatus for carrying out the method in making a flexographic printing plate which prevents dissolved chemical substance from adversely affecting human bodies and has excellent safety; capable of preventing the increase of the viscosity of developer; and capable of effectively preventing the dissolved chemical substance from adhering to the apparatus, thus preventing the life of the apparatus from being reduced and collecting the dissolved chemical substance in a short period of time and which is superior in operation efficiency, work efficiency, and treating efficiency. Solid content of liquid containing resin component which has eluted from flexographic printing plates 3, 42 and dispersed in developer is flocculated by flocculating agent, and the liquid containing the flocculated solid content is separated into the liquid and solid contents. The solid content is discharged and the liquid is re-utilized as the developer. A pH-adjustment may be performed in addition to the flocculation. The pH-adjustment may be carried out after the developer is separated into the solid content and the liquid, without performing the flocculating process.

12 Claims, 17 Drawing Sheets

DEVELOPER-CIRCULATING METHOD IN FLEXOGRAPHIC PRINTING PLATE-MAKING PROCESS AND APPARATUS FOR CARRYING OUT DEVELOPER-CIRCULATING METHOD

This application is a continuation of application, Ser. No. 08/256,260, filed Jun. 30, 1994, now abandoned, which is a U.S. application based upon International Application No. PCT/JP93/01543, filed Oct. 27, 1993.

TECHNICAL FIELD

The present invention relates to a developer-circulating method and an apparatus for carrying out the method in manufacturing a printing plate made of photosensitive resin and in particular, a flexographic printing plate of water-development type, with water-dispersion type resin grains which have been eluted in a developer (water) and which are effectively removed and the developer recycled.

BACKGROUND ART

As a developer to be used in making the flexographic printing plate, a chlorine-series solvent such as 1,1,1-trichloroethane is being replaced by an aqueous solvent which is safe and inexpensive. In inks used in printing, an oiliness type ink is more dominant than an aqueous ink. But the function of the compound composing the flexographic printing plate is that said component is dissolved in water during development which is quite different than that of water-proof ink. In order to resolve this, it is likely that a compound of a conventional water-soluble type is replaced by a compound of a water-dispersion type.

However, in the compound of the water-dispersion type, grains are formed in an eluent during development. As a result, a defective phenomena occurs such that the grains adhere to a developing device and the printing plate during development. Thus, it is necessary to solve this problem by discharging resin grains from a developer-circulating system and taking measures to dissolve the resin grains in the eluate.

As examples of performing such a treatment, there is disclosed in U.S. Pat. No. 4,239,368, an apparatus for developing a printing plate comprising a device for separating solid content from a liquid by circulating resin grains by a pump and filtering them with a cartridge filter in order to prevent a printing plate and the interior of the developing apparatus from being polluted by tailings of eluted resin.

There is disclosed in EP430,233A an apparatus, similar to the art disclosed in U.S. Pat. No. 4,239,368, for flocculating and precipitating dispersed resin (tailings) by transferring developer to a precipitation tank and allowing it to stand overnight, and then, separating solid content from liquid by means of a filter.

Conventional methods for removing resin tailings formed in developer is classified into the following two methods.

According to a first method, in order to prevent grains from being deposited as tailings, grains are stably dispersed without depositing as tailings by adding complexing agent (Examined Japanese Patent Publication No. 4-14342), carrying out the pH adjustment of the grains by adding acid or alkali (U.S. Pat. No. 4,796,042), or adding emulsifying agent. The method disclosed in EP430,233A is also intended to dissolve grains in developer or disperse them therein stably.

According to a second method, the solid content is separated from the liquid by means of a cartridge filter (U.S. Pat. No. 4,239,368; EP430,233A), or grains are allowed to stand to separate them from the liquid by flocculation (EP430,233A) to separate the solid content from the liquid.

The methods (Examined Japanese Patent Publication No. 4-14342, U.S. Pat. No. 4,796,042, and EP430,233A) for dissolving or stably dispersing grains by the addition of a complexing agent or emulsifying agent and neutralization have, however, the following problems: since it takes a long time to perform developing operation, there is a problem in safety, i.e., human bodies are seriously affected owing to the stimulation of skin or eyes caused by the increase of dissolved chemical substance; the viscosity of the developer increases, and characteristics of the developer such as pH thereof fluctuates, thus having greatly adverse effect on plate-making performance, i.e., the qualities of printing plates are nonuniform; and dissolved substances adhere to the apparatus, thus deteriorating the durability thereof and making running cost high.

Accordingly, it is an object of the present invention to solve the above-described problems, and provide a developer-circulating method and an apparatus for carrying out the method in making a flexographic printing plate superior in operation efficiency, work efficiency, and processing efficiency, i.e., a method and the apparatus which prevents dissolved chemical substances from seriously affecting human bodies so as to enhance the safety. The method is also capable of preventing an increase in the viscosity of the developer and is capable of effectively preventing the dissolved chemical substance from adhering to the apparatus. This method thus prolongs the life of the apparatus and the dissolved chemical substance can be collected in a short period of time.

DISCLOSURE OF INVENTION

In order to achieve the above object, according to the present invention, a flocculating agent is used to flocculate the solid content of a liquid containing resin component water-dispersed in a developer for developing a flexographic printing plate material; the flocculated solid content in the liquid containing the flocculated solid content is separated from the liquid; and the solid content is discharged and the liquid is re-utilized as the developer.

More specifically, the developer-circulating method comprises a process of developing a flexographic printing plate material composed of a photosensitive resin compound having a specific gravity less than one and containing water-dispersion type resin component; a flocculating step of supplying a developer containing a unexposed photosensitive resin compound discharged from the developing process and supplying a flocculating agent in the developer to flocculate the resin component contained in the developer, and discharging the flocculated liquid containing the flocculated resin component; and a solid content/liquid content separating process to separate the flocculated liquid discharged from the flocculating process into solid content and liquid content and whereby only the liquid content is supplied again into the developing process by discharging the solid content and the liquid content separately.

In the apparatus having the above construction, there can be provided a pH-adjusting process to adjust the pH of the liquid content discharged from the solid content/liquid content separating process to between 5.5 and 8.5 subsequently to the developing process and the solid content/liquid content separating process and then supplying the pH-adjusted liquid content again into the developing process.

In the aforementioned apparatus having the above construction, in flocculating the resin component by means of the flocculating agent in the flocculating process, the resin component can be floated on the liquid surface-side by allowing the developer to stand, and the floated resin component can be discharged to the solid content/liquid content separating process.

In the flocculating process, the pH of the developer containing the unexposed resin compound discharged from the developing process can be adjusted to between 5.5 and 8.5 in said apparatus.

A developer-circulating apparatus comprises a developing tank for developing a flexographic printing plate material composed of a photosensitive resin compound which has a specific gravity less than one and containing a water-dispersion type resin component; a flocculating tank in which developer containing unexposed resin compound discharged from the developing tank is supplied and then a flocculating agent is supplied to flocculate the resin component contained in the developer, and the flocculated liquid containing the flocculated resin component is discharged; and a solid content/liquid content separation device for separating the flocculated liquid discharged from the flocculating tank into solid content and liquid content whereas the solid content and the liquid content are discharged separately, and only the liquid content is supplied or recycled again into the developing tank.

The apparatus can further comprise a pH-adjusting tank, disposed between the solid content/liquid content separation device and the developing tank, for adjusting the pH of the liquid content discharged from the solid/liquid separation device to between 5.5 and 8.5 and supplying the pH-adjusted liquid content into the developing tank.

In the apparatus, the flocculating tank can further comprise a stationary tank for causing the resin component to float on the liquid surface-side in flocculating the resin component by means of the flocculating agent and to then discharge the floated resin component to the solid content/liquid content separation device.

In the apparatus having the above construction, the solid content/liquid content separation device can be a continuous type vacuum filtration device having a rotary cylindrical filtering material; and a liquid supply angle $\theta_1$ between the flocculating tank and the filtering material in a range of from a vertical line passing through the center of the filtering material to the flocculating tank is 0° through 90°.

The apparatus having the above construction can be so constructed that the vacuum filtration device has a scraper for scraping cake which has attached to the filtering material and a cake shoot, disposed below the scraper, for guiding the cake which has been attached to the filtering material so as to separate the cake therefrom; the leading end of the cake shoot has an angle in conformity to the peripheral direction of the filtering material; supposing that $\theta_2$ is an angle between the vertical line passing through the center of filtering material and the edge of the scraper, $\theta_2$=45° through 135°; supposing that $\theta_3$ is an angle between the vertical line and the leading end of the cake shoot, $\theta_3=\theta_2+(3°$ through 45°); supposing that $\theta_4$ is an angle between a tangential line drawn on the surface of the filtering material at the edge of the scraper and the scraping surface of the scraper, $\theta_4$=0° through 45°; supposing that L is an interval between the cake shoot and the surface of the filtering material, L=0 through 3 mm.

The apparatus having the above construction can be so constructed that the pH of the developer containing the unexposed photosensitive resin compound discharged from the developing tank is adjusted to 5.5 through 8.5 in the flocculating tank.

The aforementioned apparatus can be so constructed that the flocculating tank is composed of a hopper, having a cone portion at a lower portion thereof, to which the developer discharged from the developing tank is supplied to generate a rotary water flow in a peripheral direction thereof; and the developer is discharged from a lower end of the hopper.

In said apparatus, the solid content/liquid content separation device can be composed of a bag filter.

A developer-circulating method comprises a developing process of developing a flexographic printing plate material composed of a photosensitive resin compound having a specific gravity less than one and containing water-dispersion type resin component; a solid content/liquid content separating process to separating developer containing the unexposed photosensitive resin compound discharged from the developing process into solid content and liquid content, wherein the solid content and the liquid content are discharged separately, and then supplying only the liquid content into a subsequent process; and a pH-adjusting process to adjusting the pH of the liquid content discharged from the solid content/liquid content separating process to a pH between 5.5 and 8.5, wherein the pH-adjusted liquid content is then supplied or recycled back into the developing process.

The developer-circulating apparatus comprises a developing tank for developing a flexographic printing plate material composed of a photosensitive resin compound having a specific gravity less than one and containing a water-dispersion type resin component; a solid content/ liquid content separation device for separating the developer containing an unexposed photosensitive resin compound discharged from the developing tank into solid content and liquid content, and a subsequent tank for discharging the solid content and the liquid content separately wherein only the liquid content is supplied into a subsequent tank; and a pH-adjusting tank for adjusting the pH of the flocculated liquid content discharged from the solid/liquid separation device to a pH between 5.5 and 8.5, and means for recycling the pH-adjusted liquid content into the developing tank.

According to the construction of the present invention, after the solid content such as resin in the developer is flocculated, the solid content is separated from the liquid content successively. Thus, the unnecessary substances (solid content of resin not exposed to light) can be efficiently discharged from the apparatus. Therefore, the quality of manufactured printing plates are uniform; and the unnecessary or undesirable substance does not adhere to the printing plate or the apparatus; hence, the printing performance of the printing plate is not deteriorated and the durability of the apparatus is not reduced. Further, the developer from which the solid content has been removed can be recycled so that the developer can be utilized again in development and thus the running cost can be reduced. In addition, since a resin compound having a specific gravity less than 1 is used, it is easy for the solid content to float on the surface of the developer and hence liquid containing the solid content having a high density can be supplied to the solid content concentrating process through overflow. Accordingly, the solid content can be discharged effectively and the solid content-collecting time period is short. Thus, the operation efficiency, work efficiency, and processing efficiency are favorable. Furthermore, the pH of the developer from which the solid content has been removed through the solid/liquid separation process can be adjusted so that the developer has little adverse effect on the human body. Therefore, the dissolved chemical substances do not adversely affect the human body and hence the developer is safe and in addition, an increase in the viscosity of the developer can be prevented. Thus, the change in the characteristics of the developer such as pH can be reduced and printing plates can be made in uniform quality.

Further, when it is supposed that the solid content of the liquid is flocculated and the pH thereof is adjusted in the flocculating process or the flocculating tank at the same time, the solid content can be flocculated effectively, which further improves the filtering efficiency in the filtering process. In addition, the provision of the pH-adjusting tank to be used in a subsequent process can be omitted. Accordingly, a compact apparatus can be provided.

As the flocculating process or the flocculating tank, a hopper can be used which has a cone portion at a lower portion thereof, to which the developer discharged from the developing tank is supplied to generate a small rotary water flow in a peripheral direction thereof, wherein the developer is discharged from a lower end of the hopper. Therefore, it is unnecessary to provide the apparatus with a propeller stirrer and hence the apparatus is more compact and in addition, flocculated slurry can include a liquid having a uniform density and a solid content having an appropriate grain size. As a result, the clogging of the bag filter (filtering material) is minimized, thus maintaining a favorable filtering efficiency. The small rotary water flow is generated, thus causing a turbulent state and considerably preventing the solid content from adhering to the wall surface of the flocculating unit and the inner walls of pipes. Accordingly, the apparatus can be operated for a long time and the maintenance thereof can be facilitated.

BEST MODE FOR CARRYING OUT THE INVENTION

An embodiment of the present invention is described below with reference to FIGS. 1 through 14 and 16.

Figure 1:
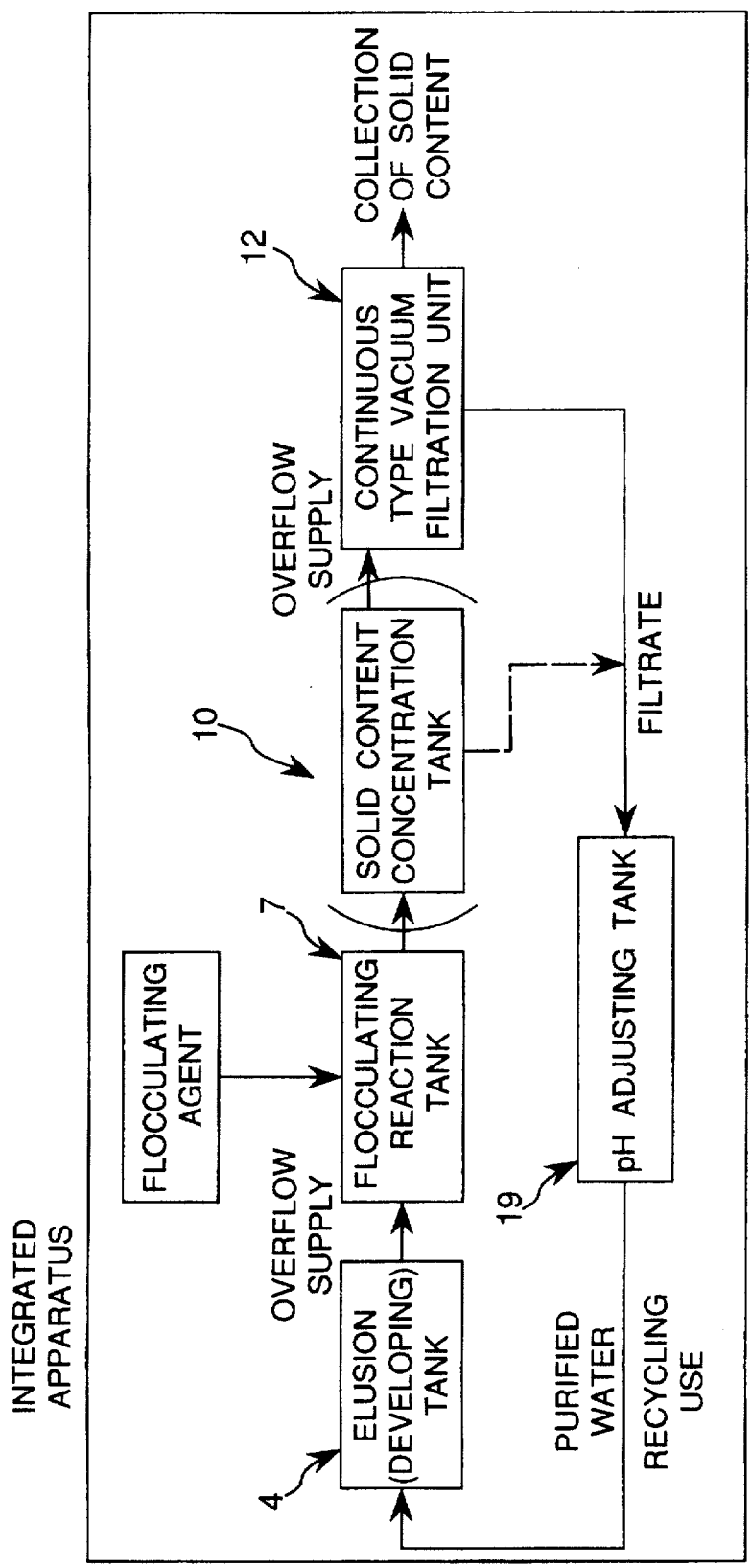
FIG. 1 is a view showing a schematic construction of an apparatus for carrying out a developer-circulating method, in a flexographic printing plate-making, according to a first embodiment of the present invention.

A developer-circulating method in making a flexographic printing plate and an apparatus for carrying out the method according to a first embodiment of the present invention, as shown in FIG. 1, generally comprises an elution unit (an elution tank or developing tank 4); a flocculation unit (a flocculation reaction tank 7 and a solid content concentration tank 10) of dispersed polymer; solid/liquid separation unit (a continuous type vacuum filtration separation unit 12); and a pH-adjusting unit (a pH-adjusting tank 19) for optimizing the pH of filtrate as a secondary treatment thereof, thus constituting a recycling closed system.

The transportation of the developer between the units is accomplished by gravity drop utilizing potential energy or a pump for feeding a fixed flow rate of liquid. An overflow by gravity drop is used to transport the developer from the elution tank 4 to the flocculation reaction tank 7 and from the solid content concentration tank 10 to the continuous type vacuum filtration separation unit 12 so that solid content floating on the surface of the developer is selectively transferred.

Depending on the capacity of the elution tank 4, an appropriate range of the flow rate of recycling developer which circulates in the developer-circulating apparatus is favorably, 1 through 30 liters/minute, and more favorably, 5 through 20 liters/minute if, for example, the capacity of the elution tank 4 is 50 liters. If the flow rate of this recycling developer is less than the appropriate range, the adherence of resin tailings to the interior of the apparatus such as the elution tank 4 becomes conspicuous. This phenomenon occurs on the flexographic printing plate 3 as well during development. If the flow rate of this recycling developer is more than the appropriate range, air suction to the liquid feeding pump or a vacuum pump of a filtering device becomes conspicuous, which leads to bubbling. Accordingly, as described above, preferably, the flow rate is adjusted to the appropriate range.

Treating process to be performed by each unit is described below.

Developing Unit

Figure 2:
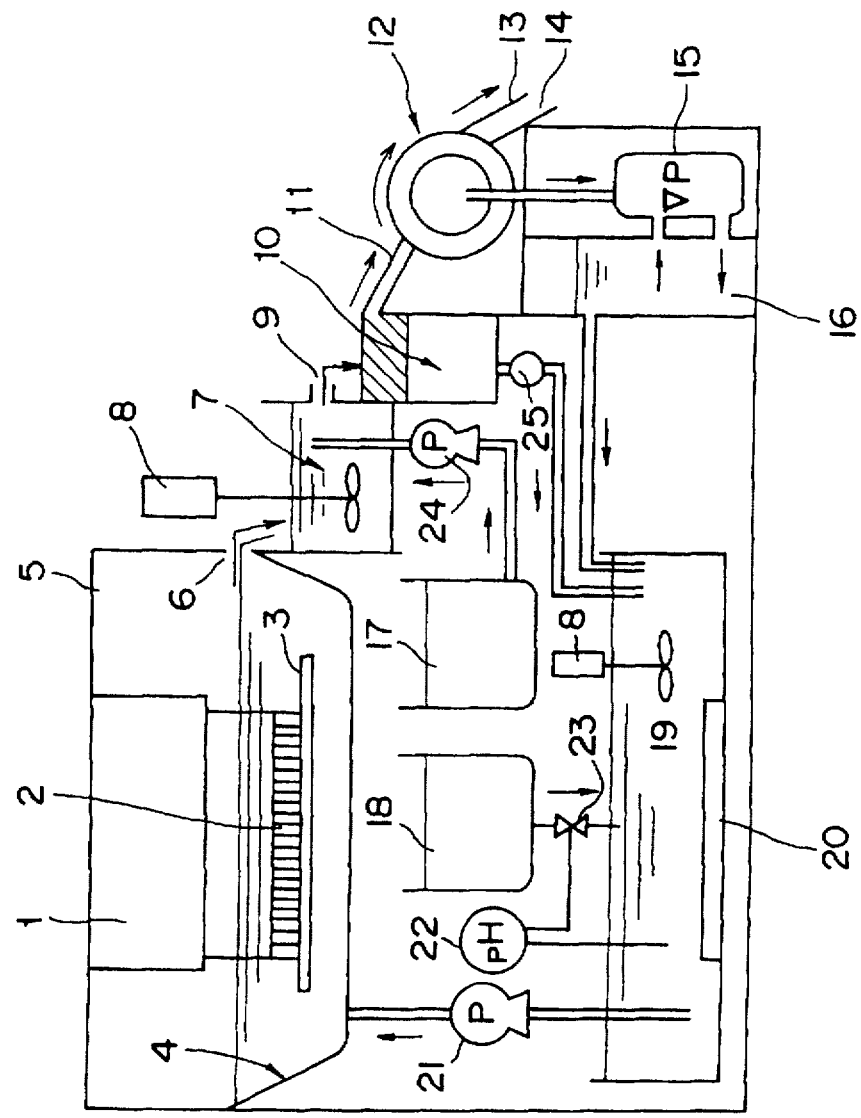
FIG. 2 is a schematic side view showing a detailed construction of the apparatus shown in FIG. 1.

As shown in FIGS. 1 and 2, from the flexographic printing plate 3 supported inside the elution tank 4, elution resin (unexposed portion) is eluted in an aqueous medium and dispersed in the developer by a brush 2. While the resin which has eluted in the aqueous medium in the elution tank 4 is being dispersed in the water, it is apt to float in the vicinity of the surface of the water because its specific gravity is lower than one. The resin is selectively overflowed from a weir 6 of the developing tank 4 so as to effectively supply it to the flocculation reaction tank 7. In addition to the overflow, an outlet can be formed on an upper portion of the developing tank 4 to discharge the developer through the outlet. When the height of the developing tank 4 is small or the amount of the developer is small, the resin is sufficiently dispersed on a lower side of the developer as well. Therefore, the developer can be discharged through a desired place, for example, a lower portion or a portion of the bottom of the developing tank 4.

Flocculating Unit

Figure 3:
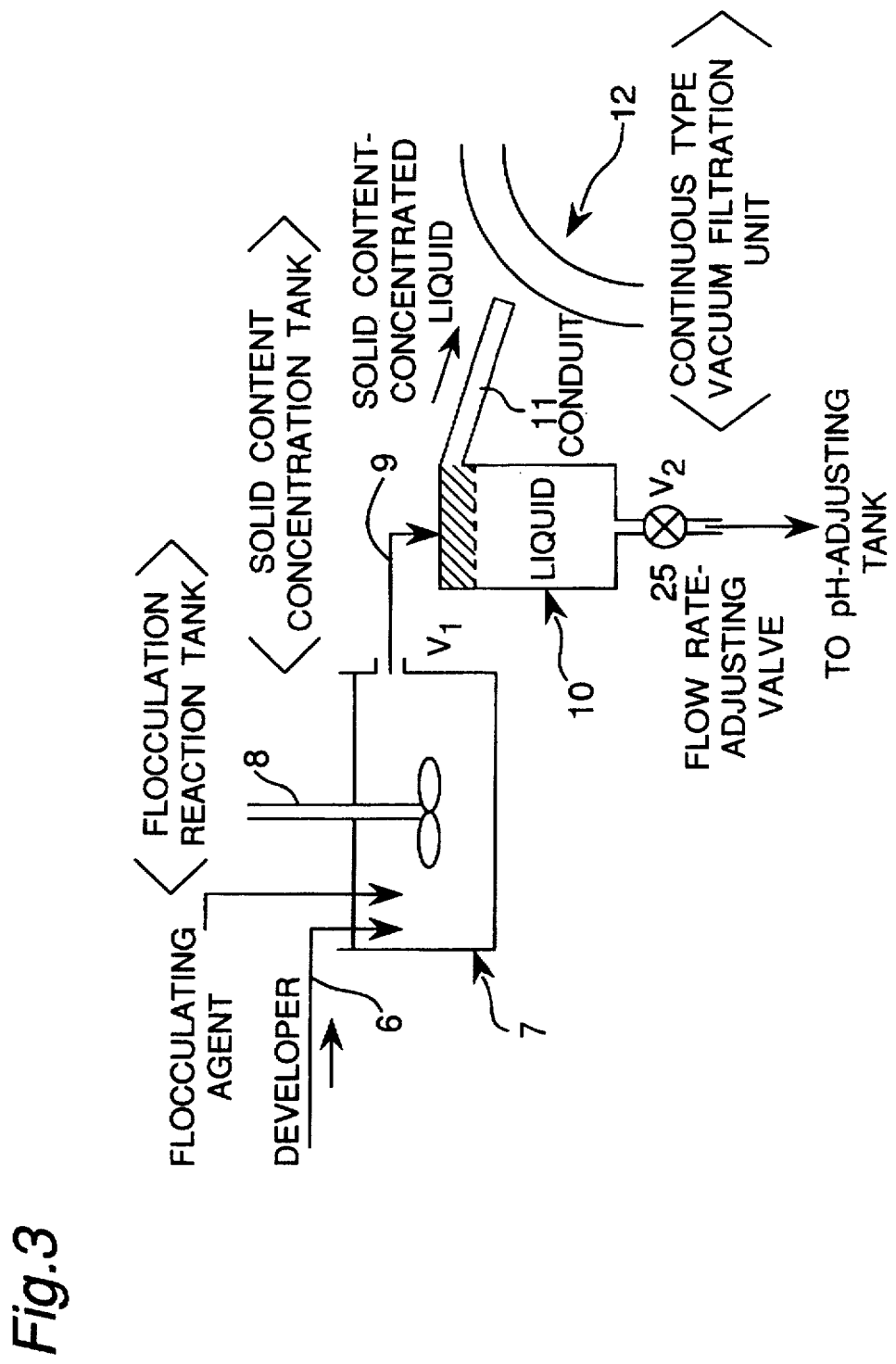
FIG. 3 is a schematic side view showing principal portions of the apparatus shown in FIG. 2.

As shown in FIGS. 1, 2, and 3, in this unit, the eluted/dispersed component is flocculated and separated from the developer by flocculating agent.

In order to make the diameter of the eluted resin grain large so that the grain size of the solid content in the developer discharged from the developing tank 4 becomes suitable for a subsequent filtering treatment, the solid content is flocculated by the flocculating agent injected quantitatively into the flocculation reaction tank 7 from the flocculating agent tank 17 by using a metering pump 24. The flocculation reaction operation is performed by using a stirring device 8 in a stirring condition. A grain size appropriate for the filtration/separation is approximately 20 microns through 2 mm. Different according to the kind of flocculating agent, favorably, the addition amount of the flocculating agent is injected by the metering pump 24 in a range of 1 ppm through 1,000 ppm of the developer (waste liquid) and more favorably, 10 through 500 ppm.

As the flocculating agent to be used in the flocculating process, inorganic and organic (polymer) flocculating agents conventionally used in treating waste water can be used. For example, as inorganic flocculating agents, aluminum salts (aluminum sulfate, sodium aluminate, polyvinyl aluminum (PAC)); iron salt (iron sulfate (II), iron chloride (III), iron sulfate (III), chlorinated copparas). As organic high molecular flocculating agents, anion polymer (sodium alginate, CMC sodium salt, poly acrylic sodium, partially hydrolyzed salt of polyacrylamide, copolymer of maleic acid); cation polymer (water-soluble aniline resin, polythionic urea, polyethyleneimine, acrylic polymer having quaternary ammonium salt in side chain, polyvinyl pyridines); nonionic polymer (polyacrylic amide, polyoxyethylene, caustic starch). Of the above substances, the high polymer flocculating agent (cation polymers or ampholytic ion polymers) not greatly affecting the pH of liquid to be treated and being safe is preferable.

The flocculated liquid is fed to the cylindrical solid content concentration tank 10 through the outlet 9 formed on an upper portion of the flocculation reaction tank 7. Since the liquid is allowed to stand in the solid content concentration tank 10, grains become large, thus floating in the vicinity of the surface of liquid, while a liquid phase is present in the lower portion of the solid content concentration tank 10. A part of the liquid in the lower portion of the solid content concentration tank 10 is sent from the bottom portion thereof to the pH-adjusting tank 19 through a flow rate-adjusting valve 25 as necessary without passing through the filtering device. As a result, the liquid in the solid content concentration tank 10 is concentrated further.

Supposing that $V_1$ is the supply amount (per time) of the developer from the flocculation reaction tank 7 to the solid content concentration tank 10; and $V_2$ is the extraction amount (per time) of the developer from the solid content concentration tank 10 to the pH-adjusting tank 19, favorably, $V_2=(0.1$ through $0.9)\times V_1$, and more favorably, $(0.3$ through $0.7)\times V_1$. The solid content concentration tank 10 can be provided as necessary, i.e., it can not be provided if it is of simplified type.

Solid/Liquid Separation Unit

As shown in FIGS. 1, 2, 3, and 4, slurry containing concentrated solid content floating in the vicinity of the liquid surface of the solid content concentration tank 10 is supplied by an overflow to the continuous type vacuum filtration unit 12, for example, a rotary cylindrical filtering material of an Oliver filter, via a conduit 11. The continuous type vacuum filtration unit 12 in the first embodiment has a rotary cylindrical filtering material known as the Oliver filter. During operation of the apparatus, the pressure inside the filtering material is kept at a pressure-reduced state, namely, at vacuum degree 400 through 600 mmHg, and the water content of the slurry supplied to the continuous type vacuum filtration unit 12 via the conduit 11 is absorbed into the filtering material to dehydrate the slurry so that the solid content is adhered to the surface of the filtering material. The rotational speed of the filtering material is arbitrarily adjusted according to the formation speed of cake (dehydrated solid content). The filtering material is rotated around a center shaft by a rotary motor provided to drive only the filtering material. The solid content which has adhered to the surface of the filtering material is dehydrated by the suction force of a vacuum pump 15 via the filtering material. Thereafter, the solid content (cake-shaped) is discharged to the outside of the apparatus due to the scraping effect of the scraper 13 and the cake shoot 14. The vacuum pump 15 is of water-sealed type, and hence supplementary water is supplied thereto from a filtrate tank 16. Filtered liquid is collected into the filtrate tank 16 disposed alongside the vacuum pump 15.

The filtering material is composed of porous material (average of hole diameters: several microns through several tens of microns). The filtering material is wound around a porous drum, or molded into a cylindrical configuration if the filtering material is hard. The filtering material made of diatomaceous earth is best known. In addition, resin in the form of a sponge layer made of soft polyvinyl acetal (Examined Japanese Patent Publication No. 64-10247) and a porous material formed by mixing hard phenol resin and polyvinyl acetal resin with each other (Examined Japanese Patent Publication No. 3-66004); ceramic; and material made of carbon may be used. Any of these filtering material can be advantageously utilized in the present invention.

Figure 4:
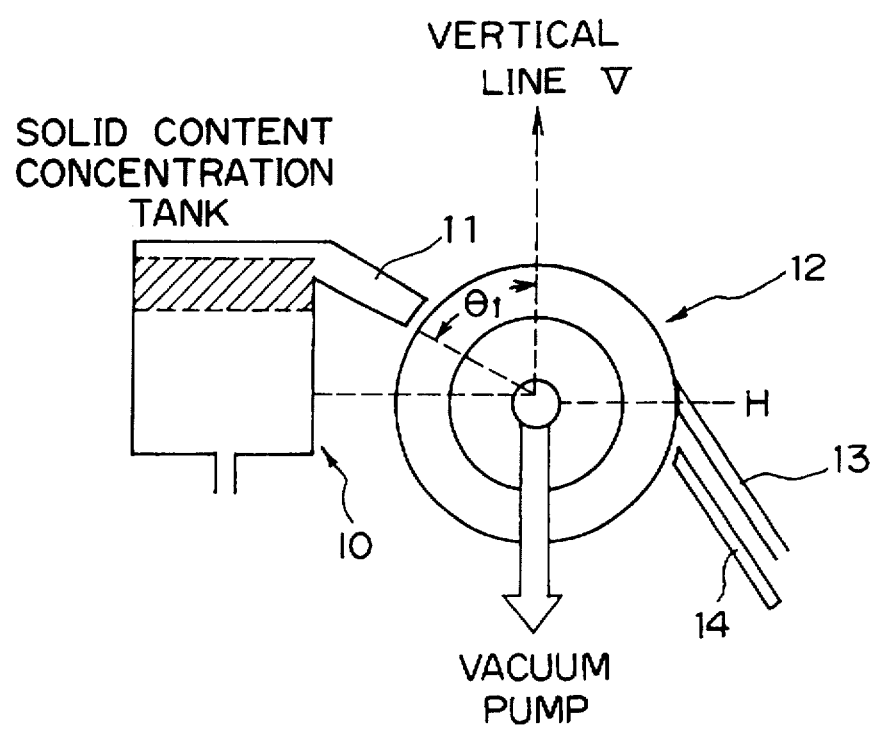
FIG. 4 is a schematic side view showing principal portions of the apparatus shown in FIG. 2.

The method for supplying the developer to the Oliver filter is carried out as follows: It is necessary to supply the slurry to the cylindrical filtering material from above (namely, top feeding) a virtual horizontal line (H) passing through the center of the filtering material, as shown in FIG. 4.

Figure 5:
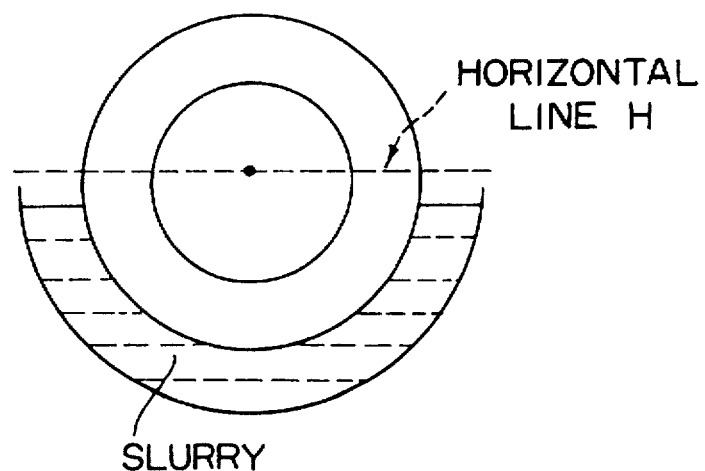
FIG. 5 is a descriptive view for describing a method of supplying an Oliver filter with slurry.

Bottom feeding of the developer from below the horizontal line (H) is inappropriate, as shown in FIG. 5. The reason for this is because the density of the solid content in the developer is low. It is necessary that the density of the solid content is at least 4 through 5% (density of dried solid content) to pick up the solid content through the adhesion thereof to the filtering material in the bottom feeding. The density of the solid content in the liquid is 0.1 through 1% during continuous elution operation and less than 3% if the liquid is concentrated in a previous stage. Thus, the developer is supplied from the solid content concentration tank 10 to the cylindrical filtering material by top feeding, while a liquid supply angle $\theta_1$ between the solid content concentration tank 10 and the cylindrical filtering material in the range of from a vertical line (V), as reference, passing through the center of the filtering material to the solid content concentration tank 10 is favorably, $\theta_1=0°$ through 90°, and more favorably, 20° through 70°.

Figure 6:
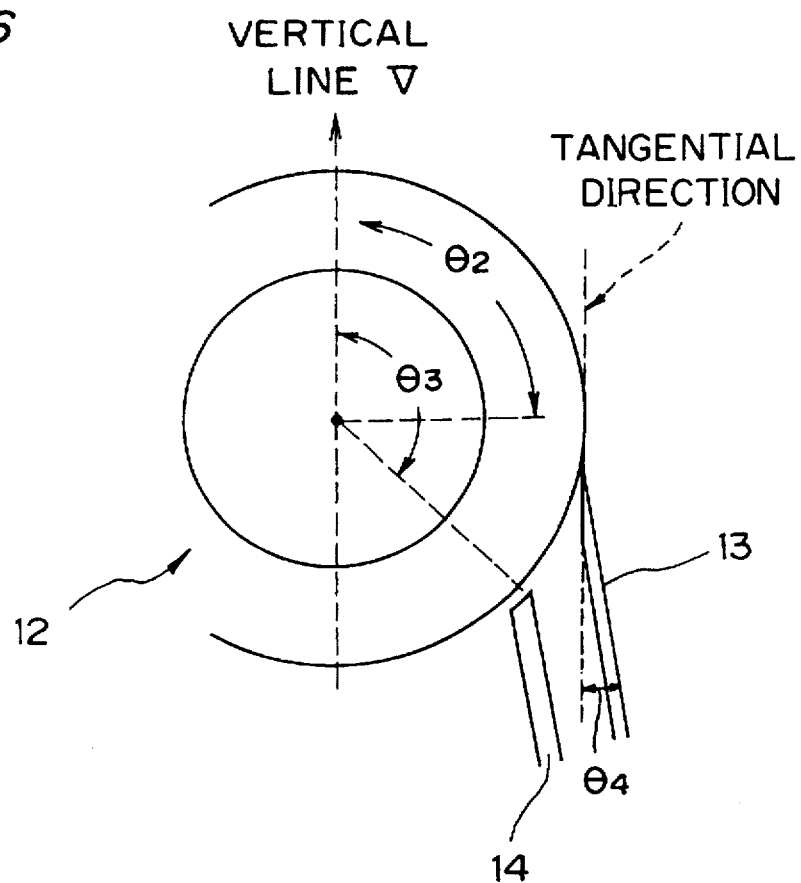
FIG. 6 is a descriptive view for describing scraping of cake which has adhered to a filtering material of the Oliver filter.
Figure 7:
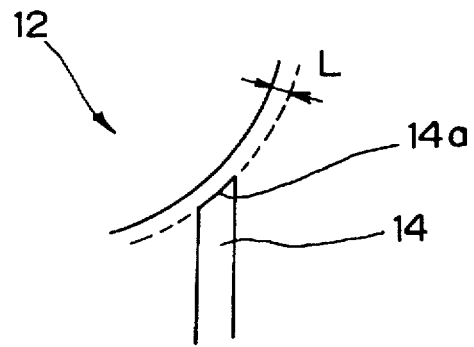
FIG. 7 is a partly enlarged view showing a cake shoot of the Oliver filter.

If the density of the solid content in the developer is as low as 0.1 through 3% in scraping the cake which has adhered to the surface of the filtering material, the thickness of the cake is frequently 1 mm or less. Consequently, generally, it is difficult to remove the cake by only one scraper 13, as is often the case with sticky resin. Therefore, as shown in FIG. 6, it is necessary to install, below the scraper 13, the cake shoot 14 with which the cake scraped from the filtering material by the scraper 13 is guided to remove therefrom. As shown in FIG. 7, preferably, the leading end of the cake shoot 14 has an angle in conformity to the peripheral direction (or tangential direction) of the filtering material so as to improve the collecting performance thereof. Accordingly, supposing that $\theta_2$ is an angle between the vertical line (V) (passing through the center of filtering material) and the edge of the scraper 13, favorably, $\theta_2=45°$ through 135°, and more favorably, 60° through 120°. Supposing that $\theta_3$ is an angle between the vertical line (V) and the leading end of the cake shoot 14, favorably, $\theta_3=\theta_2+$ (3° through 45°), and more favorably, $\theta_2+(5°$ through 30°). Supposing that $\theta_4$ is an angle between a tangential line drawn on the surface of the filtering material and the scraping surface of the scraper 13, favorably, $\theta_4=0°$ through 45°, and more favorably, 5° through 30°. Supposing that L is an interval between the cake shoot 14 and the surface of the filtering material as shown in FIG. 7, favorably, L=0 through 3 mm, and more favorably, 0.1 through 2 mm.

The conventional collecting method (EP430,233A) based on the separation of resin grains from liquid owing to the precipitation thereof caused by allowing developer to stand and the collecting method (U.S. Pat. No. 4,239,368 and EP430,233A) based on the separation of resin grains from the liquid by means of a cartridge filter have problems that it takes much time to collect solid content because the developer is left overnight and thus operability and efficiency are unfavorable; an amount to be treated is small; and a filter clogs in a short period of time and it is necessary to replace filters repeatedly if the amount of the developer to be treated is to be increased. These problems do not occur when the Oliver filter is used, and thus the present invention is advantageous in this point.

pH-Adjusting Unit

The filtrate in the filtrate tank 16 is sent to the pH-adjusting tank 19 by the overflow. The developer taken out from the bottom of the solid content concentration tank 10 is supplied into the pH-adjusting tank 19 through the flow rate-adjusting valve 25. That is, transparent filtrate obtained by almost completely removing the solid content obtained in the solid content-concentrating process and the filtering process previously performed is supplied to the pH-adjusting tank 19. By automatic control of a pH sensor 22, a necessary amount of pH-adjustor (acid or alkali) is supplied to the pH-adjusting tank 19 from the tank 18 through an electromagnetic valve 23. The pH-adjustor means acid or alkali. Since the developer indicates weak alkali (pH: 9.5 through 9.8), acid is mainly preferably used to neutralize the weak alkali. As acids, inorganic acid such as sulfuric acid, hydrochloric acid, or nitric acid, or organic acid such as citric acid, malic acid, or acetic acid is used by preparing water solution thereof diluted appropriately (about 1 through 10%). In addition, as necessary, a heater 20 for keeping the pH-adjusting tank 19 at a temperature suitable for a subsequent developing process can be provided in the pH-adjusting tank 19. Purified liquid re-obtained by the pH-adjustment in the above manner is returned to the developing tank 4 through a feed-back pump 21 and then utilized for elution again.

When photosensitive resin compound disclosed in Japanese Laid-Open Patent Publication No. 1-300246 or Japanese Laid-Open Patent Publication No. 5-150451 is used as material for composing a printing plate, basic substance is dissolved in water to some extent. Consequently, the liquid becomes weak-alkali (pH: 9.5 through 9.8). It is necessary to keep the pH of the developer to at least the effluent standard value or less in consideration of an operator's safety even though the pH of the developer is weak-alkali. The pH-adjusting range is set to 5.5 through 8.5 by the control of a microcomputer incorporating the pH meter 22. If the pH is less than 5.5, not only the developing performance of a printing plate can be adversely affected, but also a portion of the apparatus in contact with the developer may be corroded with the elapse of time. If the pH is more than 8.5, there is a possibility that a human body, for example, the operator's skin is affected. If a compound is apt to be dispersed in the entire developer due to its self-emulsification action when the pH is more than 9, the pH is adjusted to 8.5 or less so as to restrain the self-emulsification action and facilitate flocculating/separating operation to be performed in a later stage.

Figure 21:
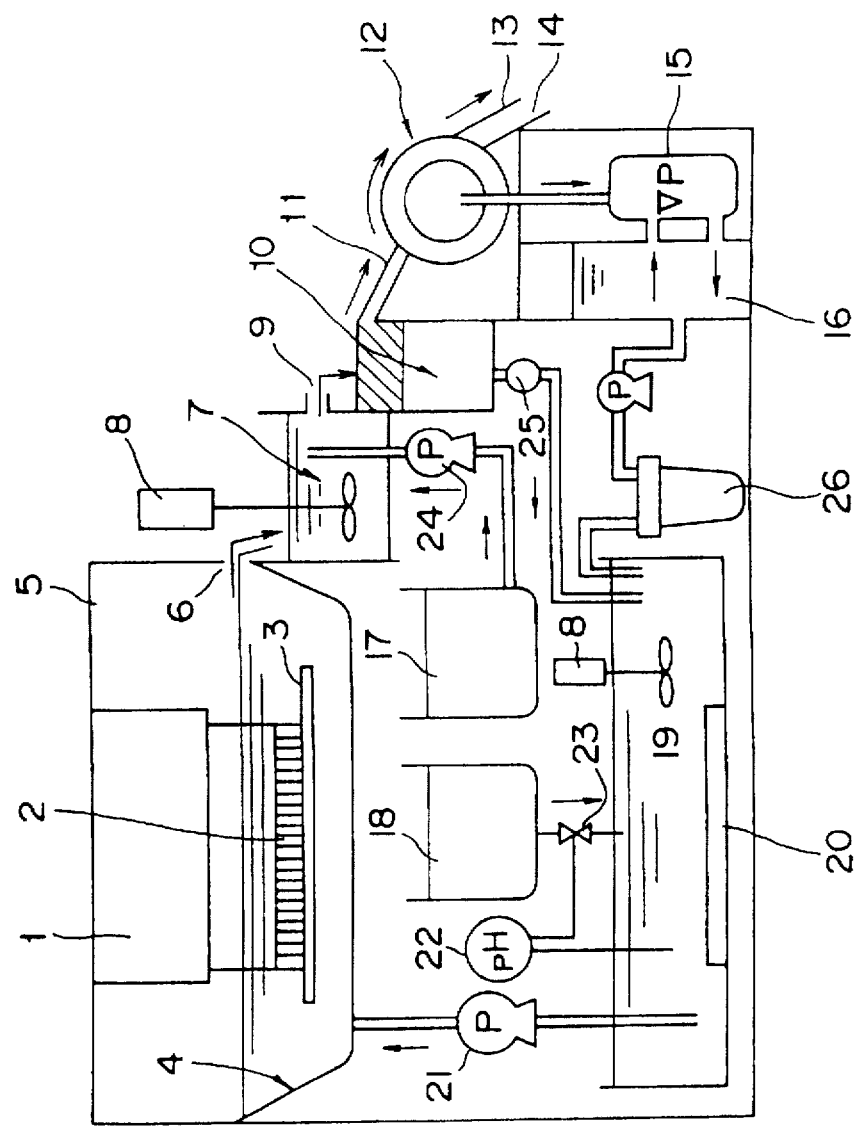
FIG. 21 is a schematic side view showing the apparatus according to the first embodiment of the present invention with which an ion exchange cartridge is provided for a pH-adjustment.

As another method of adjusting the pH, an absorbing carrier is used to absorb/remove a basic nitrogen-contained compound, of the photosensitive resin compound, which has dissolved in the developer (water) so as to remove it from the developer. This method makes it possible for the pH of the developer to be kept within a pH range appropriate for plate-making without increasing the pH. Activated carbon and ion exchange resin are used as absorbing carriers in the above method. If the basic nitrogen-contained compound is water-soluble, the utilization of the ion exchange resin is preferable because it is superior in the property of absorbing it. As the ion exchange resin, strong acid cation exchange resin represented by Imberite IR-120B (manufactured by Rome and Hurse Corp.) is most favorable. As the method of using the ion exchange resin, preferably, after the ion exchange resin is encapsulated in a bag of about 50 through 200-mesh (about 300 through 70 microns), the bag is immersed in the pH-adjusting tank 19 shown in FIG. 2, or the bag is installed to be filled in an ion exchange resin cartridge 26 provided on a path through which the liquid to be treated is fed from the filtrate tank 16 of the Oliver filter to the pH-neutralization tank 19, as shown in FIG. 21. In this manner, the ion exchange resin can be conveniently replaced. A time for replacing the ion exchange resin should be judged by a control method of a pH measured by the pH meter 22 provided in the neutralization tank or the conductivity of the filtrate.

If merely the pH-adjustment is incapable of completely preventing the occurrence of the self-emulsification action of the compound and adjusting the grain diameter to a grain size range appropriate for separating the solid content from the liquid, the solid content is dissolved in the liquid or fine grains less than a proper grain size are precipitated, flocculated, and dissipated in the liquid by providing the flocculating process of adding a proper amount of flocculating agent to the liquid subsequent to the developing process. In this manner, the solid content can be removed. Thus, the filtering material of the vacuum filtering device can be prevented from clogging, and hence the liquid-treating performance per time and the efficiency of dehydrating water content from the cake can be improved.

As an example, comparison data obtained in a case in which only pH-adjustment of a liquid was performed, a case in which the pH-adjustment of a liquid was performed and flocculating agent was used, and a case in which neither pH-adjustment of a liquid was performed nor flocculating agent was used is shown below.

EXAMPLE (Preparation of Plate Made of Photosensitive Resin)

Five hundred parts of xylene solution (density of solid content: 90%) of LIR30 (isoprene polymer, estimated molecular weight: 29,000, manufactured by Kurare Co., Ltd), 30 parts of maleic anhydride, and one part of NOC-RAC 6C (N-phenyl-(1,3-dimethlbutyl)-p-phenyldiamine, manufactured by Ouchi Shinko Chemical Industry Co., Ltd.) were put into a two-liter-volume four-opening flask on which a stirrer, a reflux condenser, nitrogen-introducing pipe, and a thermometer had been installed. Then, the substances were allowed to react with each other at 190° C. for six hours with nitrogen gas current present. Thirty parts of n-butanol, three parts of N,N-dimethylbenzilamine, and 17 parts of xylene were added to polymer of maleic isoprene thus obtained, and these substances were allowed to react with each other at 135° C. for 30 minutes. In polymer of maleic half-ester-denatured isoprene thus obtained, the density of solid content was 90%, acid value of solid content consisting of resin was 40, and the molecular weight thereof was 32,000. Seven parts of N,N-dimethylaminopropylmethacrylamide, 28 parts of copolymer of styrene-isoprene-styrene (Clayton #1107, manufactured by Shell Corp., diene monomer unit at 90 mole %, molecular weight 140,000, rubber portion was −60° C. and styrene portion was 95° C. as glass transition temperature), 13 parts of methacrylic acid lauryl, 10 parts of 1,6-hexandioldimethacrylate, 0.25 parts of 2-ethylanthraquinone, 0.25 parts of benzoil methyl ether, and 0.5 parts of 2,6-di-t-butyl-p-cresol were added to five parts of the above polymer and 36 parts of bridged grain polymer (grain diameter: 0.05μ) consisting of 69.0 wt % of 1,3-butadiene, 9.0 wt % of methacrylic acid, 2.0 wt % of divinyl benzene, and 20.0 wt % of methyl methacrylate.

The substances of the mixture thus obtained were fully mixed by pressure-applying two-axis kneader. A photo polymerization resin compound thus obtained was extruded, by a kneader pressing device having a T-die, on a polyester film to which chloroprene adhesive agent and HIBON 1920LT (manufactured by Hitachi Chemical Co., ltd.) had been applied in a thickness of 5μ. As a result, a plate having a 1.7 mm thick photosensitive resin layer was obtained.

Irradiation was carried out for 10 minutes by an ultraviolet lamp of 350 W, with a negative film having an appropriate image uniformly brought into contact with the surface of the photosensitive resin layer of each of photosensitive resin plates in vacuum, and photosensitive resin plates were developed for five minutes per photosensitive resin plate by using water of 40° C. by the apparatus according to the first embodiment. In order to adjust the pH-adjustment of the developer, 1% dilute sulfuric acid was used. As flocculating agent, 0.02% water solution of Sunflock C-109P (acrylic polymer having quaternary ammonium salt in side chain; cationic high polymer flocculating agent, manufactured by Sanyo Chemical Co., Ltd) was used.

Table 1 shows comparison data obtained in a case in which only pH-adjustment of a developer was performed (experiment No. 2), in a case in which the pH-adjustment was performed and flocculating agent was used (experiment No. 1), and in a case in which neither the pH-adjustment was performed nor flocculating agent was used (experiment No. 3).

TABLE 1

| [Common condition] | | | |
|---|---|---|---|
| size of plate to be developed (number of plates) | developing time period | capacity of developing tank | recycling flow rate |
| A2 size (10 plates) | 50 minutes (5 minutes/ plate) | 50 liters | 5 liters/min |

| [Individual condition] | | |
|---|---|---|
| experiment No. | adjusted pH* | addition amount of flocculating agent (ppm) |
| 1 | 7.0 | 10 |
| 2 | ↑ | 0 |
| 3 | 8.8 (not adjusted) | 0 |

[Experimental result - comparison between solid/liquid separating performance and dehydration rate of cake]

| Experiment No. | treating performance (liter/min) (Note 1) | percentage (%) of solid content in cake (Note 2) |
|---|---|---|
| 1 | 7.5 | 56 |
| 2 | 5 | 32 |
| 3 | <0.5 (cannot be filtered in 10 minutes) | 17 |

*Measured by the pH meter 22 provided inside the pH-adjusting tank 19 (40° C.)
Note 1)
Cylindrical filtering material (hole diameter: 25 microns) having a surface area 700 cm² was used.
Note 2)
Percentage of solid content in cake scraped by scraper is shown. (Number of rotations of filtering material: 10 rpm, ultimate vacuum: −600 mmHg)

In the experiments Nos. 1 and 2, the developing performance of a plate relief was favorable. In the experiment No. 3 in which the solid could not be separated from the liquid, the solid content of resin was accumulated in the developing tank 4. As a result, the resin layer adhered to the brush 2 and the tank of the flexographic printing plate 3 during development and hence, a favorable plate relief could not be formed.

The developer is circulated in the above-described unit.

Photosensitive resin compositions suitable for the application to the developer-circulating method and the apparatus for carrying out the method in the flexographic plate-making process are less than 1 in specific gravity, and more favorably, 0.85 through 0.99, and in addition they are required to be developable by using water or an aqueous medium. Preferably, as shown in Japanese Laid-open Patent Publication No. 1-300246 and Japanese Laid-Open Patent Publication No. 5-150451 the compositions comprise: three-dimensional bridged grain polymer (Microgel) having a diameter of 0.01 through 5μ obtained by polymerizing mixture of aliphatic conjugate diene monomer and monofunctional ethylene unsaturated monomer and/or multifunctional ethylene unsaturated monomer; hydrophobic elastomer having a molecular weight of 5,000 through 1,000,000 and containing at least 30% mole of conjugate diene monomer unit per molecular in the compound; compound containing basic nitrogen atoms; photo polymerization ethylene unsaturated monomer; and photo polymerization initiator.

Depending on necessity, compound including photosensitive resin compound consisting of hydrophilic polymer containing hydrophilic functional group and the molecular weight of which is 1,000 through 1,000,000 is also suitable.

The following polymers are suitable provided that specific gravities thereof are in the above-described range: aliphatic conjugate diene, namely, homopolymer or copolymer such as butadiene, isoprene, and isobutylene; copolymerization resin (including block copolymerization) consisting of conjugate diene and (meta) acrylic acid or (meta) acrylic ester, and styrene monomer; organic acid such as maleic acid thereof; and amine-denatured resin.

But as an example, elastomer containing heavy atom such as chlorine in a great amount, for example, a part of chloroprene rubber and chlorinated polyethylene has a specific gravity more than one. Therefore, compound containing such components is unsuitable. Preferably, photosensitive resin compound to be used in the present invention does not have a problem in development even though emulsifying agent is not used in dispersing resin of an unexposed portion in the developer.

According to the present invention, water is used as the developer. As water, purified city water is preferable. Preferably, ion exchange resin is used for natural water such as ground water which is high in hardness and hence unsuitable for plate-making, or the natural water is distilled to make it soft.

It is not always necessary to add water-soluble organic solvent (for example, alcohols) or surface active agent to the developer.

According to the first embodiment, after the solid content such as resin in the developer is flocculated, the solid content is separated from the liquid successively. Thus, an unnecessary substance (solid content) can be efficiently discharged from the apparatus. Therefore, the quality of manufactured printing plates are uniform, and the unnecessary resin does not adhere to the printing plate or the apparatus. Thus, it can greatly prevent the printing performance of the printing plate from being deteriorated and the durability of the apparatus from being reduced. Further, the developer from which the solid content has been removed can be recycled so that the developer can be utilized again in development and thus running cost can be reduced. In addition, since the resin compound having a specific gravity less than 1 is used, it is easy for the solid content to float on the surface of the developer and hence liquid containing the solid content having high density can be supplied to the solid content concentrating process. Accordingly, the solid content can be discharged effectively and solid content-collecting time period is short. Thus, operation efficiency, work efficiency, and processing efficiency are favorable. Furthermore, the pH of the developer from which the solid content has been removed can be adjusted so that the developer does not adversely affect a human body. Therefore, dissolved chemical substances do not adversely affect a human body and hence the developer has excellent safety and in addition, the increase in the viscosity of the developer can be prevented. Thus, the change in the characteristics of the developer such as pH can be reduced and printing plates can be made in uniform quality.

Figure 8:
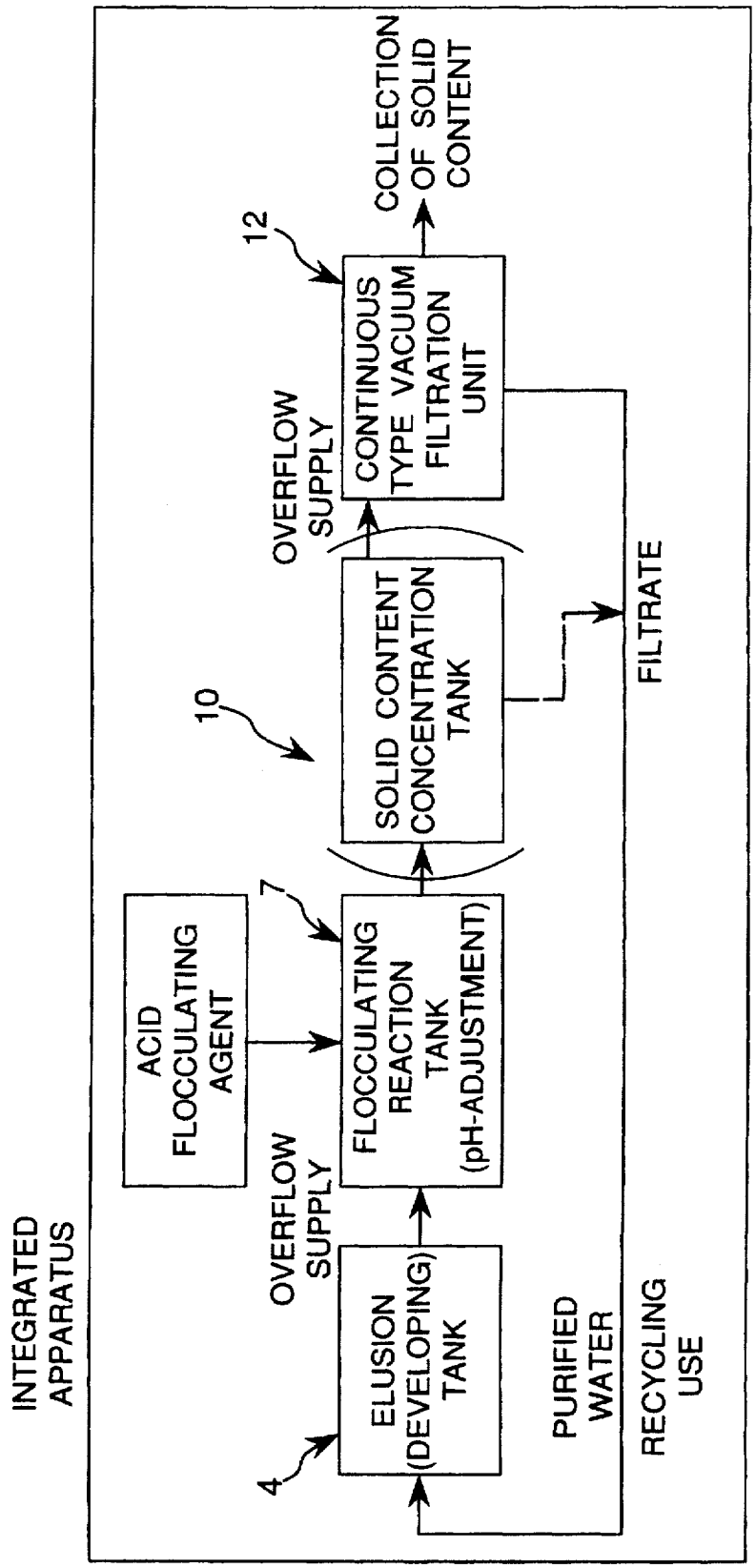
FIG. 8 is a view showing a schematic construction of an apparatus according to a second embodiment of the present invention.
Figure 9:
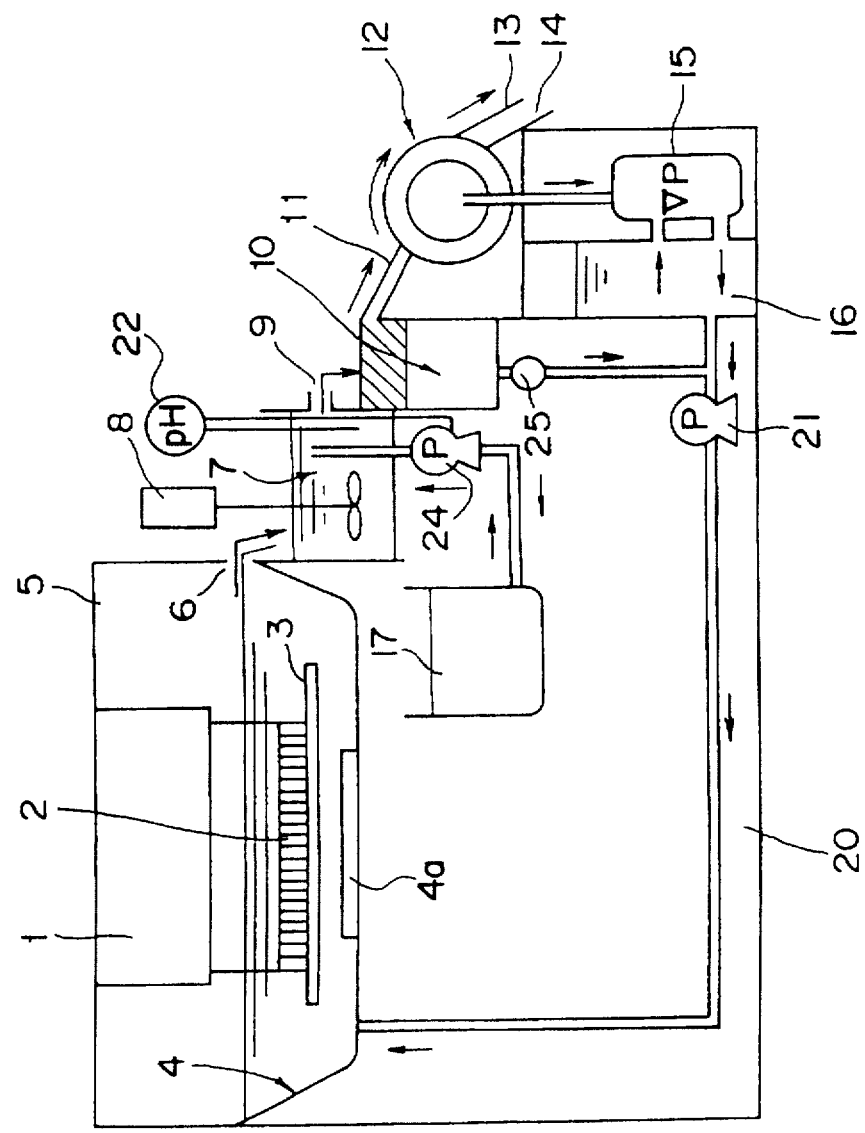
FIG. 9 is a schematic side view showing a detailed construction of the apparatus shown in FIG. 8.

The present invention is not limited to the first embodiment, but can be embodied in various aspects. For example, as shown in FIGS. 8 and 9, according to the second embodiment, it is possible to adjust, in the flocculation reaction tank 7, the pH of the developer containing a resin compound of an unexposed portion discharged from the developing tank 4. It is preferable to select flocculating agent, to be used in the second embodiment, having a function of flocculating the solid content, dissolved or dispersed in liquid to be treated, in a grain size appropriate for separating the solid content from the liquid and a function of adjusting the pH of the developer. More specifically, the following inorganic flocculating agents (hereinafter referred to as acidic flocculating agent) indicating acidic property in water solution are favorable: aluminum salt (aluminum sulfate, sodium aluminate, polyvinyl aluminum); and iron salt (iron sulfate (I), iron chloride (III), iron sulfate (III), chlorinated copparas). Of the above, aluminum salt having property of not coloring filtrate is used more favorably. Inorganic acids such as sulfuric acid, hydrochloric acid, and nitric acid; and proton acid such as organic acid, for example, citric acid, malic acid, and acetic acid may be used as flocculating agent, although these substances are a little inferior to the above-described inorganic flocculating agents in flocculating effect. The substances utilized as the pH-adjustors in the pH-adjusting unit in the first embodiment may be used as these substances. As shown in FIG. 9, a necessary amount of flocculating agent is supplied from the flocculating agent tank 17 to the flocculation reaction tank 7 via the metering pump 24 by an automatic control of the pH-meter 22 which measures the pH of the liquid to be treated in the flocculation reaction tank 7. As described above, in the second embodiment, the solid content of the liquid to be treated is flocculated and the pH thereof is adjusted in the flocculation reaction tank 7 at the same time. Thus, the pH-adjusting tank is not required in the second embodiment unlike the first embodiment (see FIG. 2). Accordingly, the performance of separating the solid content from the liquid is superior to that of the first embodiment and in addition, the entire apparatus is smaller in size than that of the first embodiment, and thus, the second embodiment can be advantageously manufactured. In this case, preferably, a heater 4a for keeping the liquid hot is disposed in the elution tank. Tests generally similar to the examples made on those according to the first embodiment were conducted by using the apparatus (FIG. 9) according to the second embodiment. The examples of the second embodiment are different from those the first embodiment in that 1% water solution of aluminium sulfate was used as flocculating agent.

The experimental result is shown below together with the result (experiment No. 5) of the first embodiment.

TABLE 2

| [Common condition] | | | |
|---|---|---|---|
| size of plate to be developed (number of plates) | developing time period | capacity of developing tank | recycling flow rate |
| A2 size (10 plates) | 50 minutes (5 minutes/ plate) | 50 liters | 5 liters/min |

Addition amount of flocculating agent: 20 ppm (average value);
Adjusted pH: 6.0

[Experimental result - solid/liquid separating performance and dehydration rate of cake]

| Experiment No. | apparatus used | treating performance (Note 1) (liter/min) | percentage (%) of solid in cake (Note 2) |
|---|---|---|---|
| 4 | FIG. 9 | 8.5 | 59 |
| 5 | FIG. 2 | 7 | 53 |

Note 1)
Cylindrical filtering material (hole diameter: 25 microns) having a surface area 700 $cm^2$ was used.
Note 2)
Percentage of solid content in cake scraped by a scraper is shown.
(Number of rotations of filtering material: 10 rpm, ultimate vacuum: −600 mmHg)

In the experiments Nos. 4 and 5, each of developing performance of a plate relief was favorable.

The pH-adjusting treatment may be omitted if the developer is safe and the solid content can be separated from the liquid smoothly even though pH-adjustment is not performed.

Figure 10:
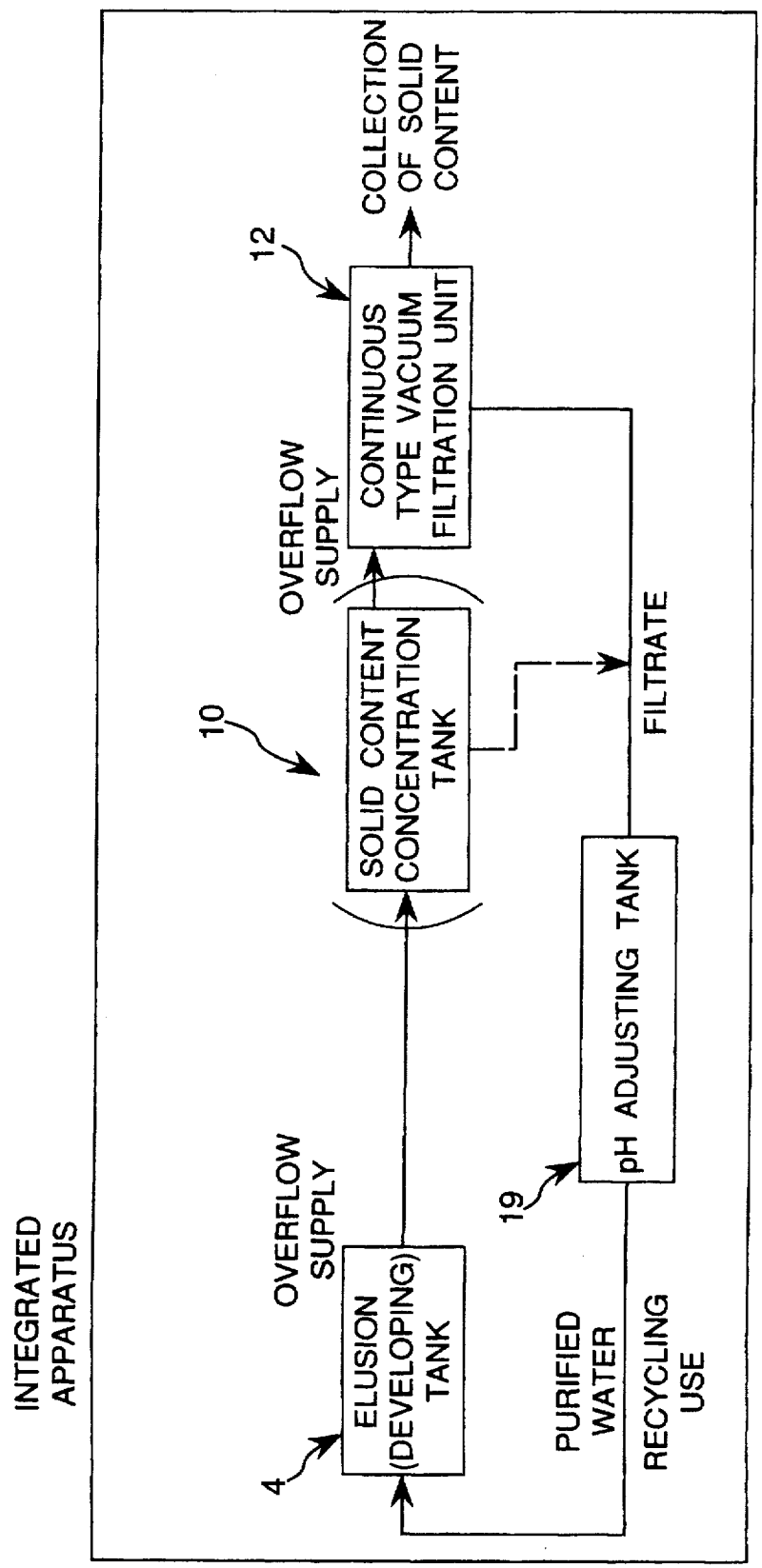
FIG. 10 is a view showing a schematic construction of an apparatus according to a third embodiment of the present invention.
Figure 11:
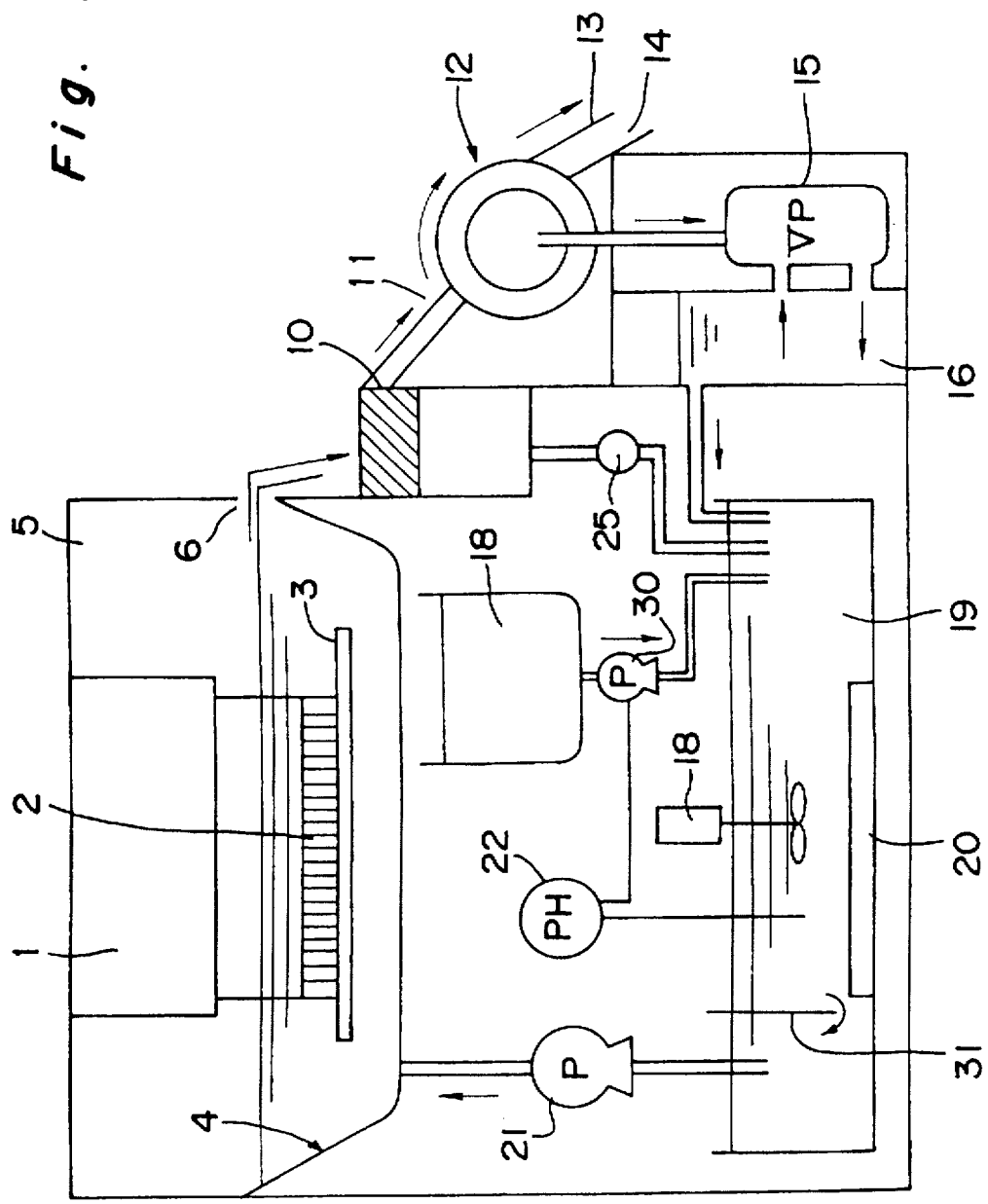
FIG. 11 is a schematic side view showing a detailed construction of the apparatus shown in FIG. 10.

In a third embodiment, as shown in FIGS. 10 and 11 and by the above-described experiment No. 2, if a grain size attained is generally suitable for separating the solid content from the liquid by merely adjusting the pH of the developer, the provision of the flocculation reaction tank 7 may be omitted and the solid content concentration tank 10 may be provided at a portion subsequent to the developing tank 4. That is, in FIG. 11, the developer discharged from the weir 6 of the developing tank 4 is supplied into the solid content concentration tank 10 so that the above-described operation for separating the solid content from the liquid is performed. Referring to FIG. 11, reference numeral 30 denotes a metering pump for measuring the amount of pH-adjustor, and 31 denotes a weir for preventing a short pass of liquid flow in the pH-adjusting tank 19.

It is possible to omit the provision of the flocculation reaction tank 7 and the solid content concentration tank 10 and connect the developing tank 4 with the vacuum filtration unit 12 directly.

A fourth embodiment is described below.

In a conventional stirrer-equipped flocculating tank, the short pass of a liquid flow occurs and hence it is difficult to mix the flocculating agent with the developer uniformly. As a result, a flocculation-insufficient portion accelerates the clogging of the filtering material. A portion causing an excessive flocculation soils tanks and the wall surfaces of pipes, thus preventing the smooth flow of the developer and making it difficult to perform maintenance.

In order to solve these problems, it is possible to provide a function of flocculating the solid content in the developer by means of flocculating agent and separating the solid content from the liquid, and neutralizing the filtrate to be re-utilized, by using the above-described acidic flocculating agent in the flocculating process so as to adjust the pH of the developer to 5.5 through 8.5.

In the fourth embodiment, in the flocculating process, improvements are made on the apparatus so as to uniformly mix acidic flocculating agent with the developer discharged from the elution tank by an overflow.

According to the above construction, the developer discharged by the overflow is introduced horizontally into a hopper having a cone portion at a lower portion thereof so as to generate a rotary water flow. Therefore, the solid content in the developer can be efficiently uniformly flocculated by accelerating the mixture of the flocculating agent which has dripped from an upper portion of the hopper. Because the rotary water flow generated in the hopper causes a turbulent state in a pipe connected with a portion subsequent to the hopper, it is effective for preventing the inner wall of the pipe from being polluted (due to adherence of solid content) even though time elapses. Slurry containing an appropriate amount of flocculating agent uniformly mixed with the developer prevents the solid content from clogging on a bag-shaped filter in a great degree, thus improving filtering efficiency remarkably.

Each unit of the apparatus according to the fourth embodiment is described below.

Developing Unit

Figure 12:
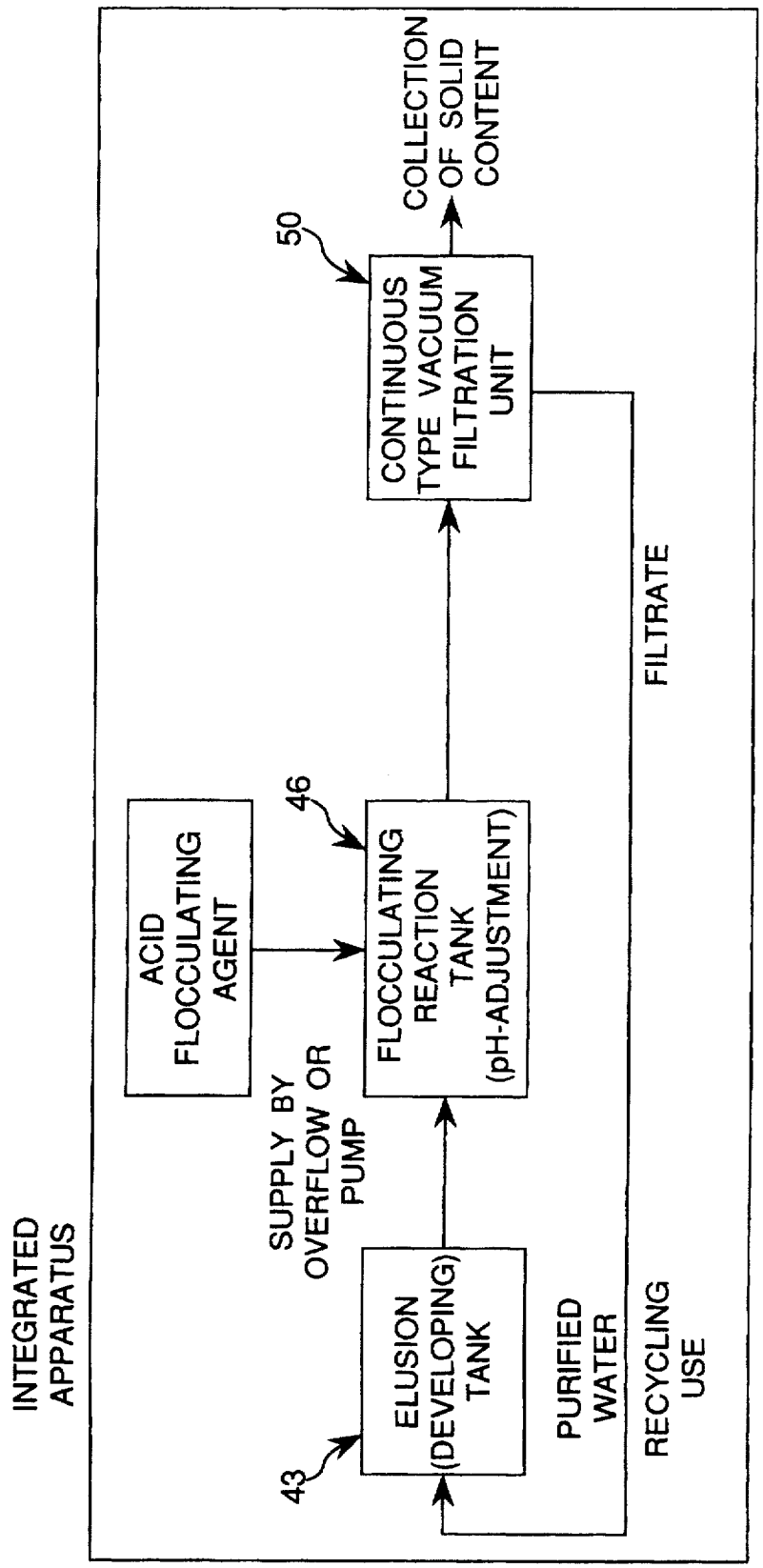
FIG. 12 is a view showing a schematic construction of an apparatus according to a fourth embodiment of the present invention.
Figure 13:
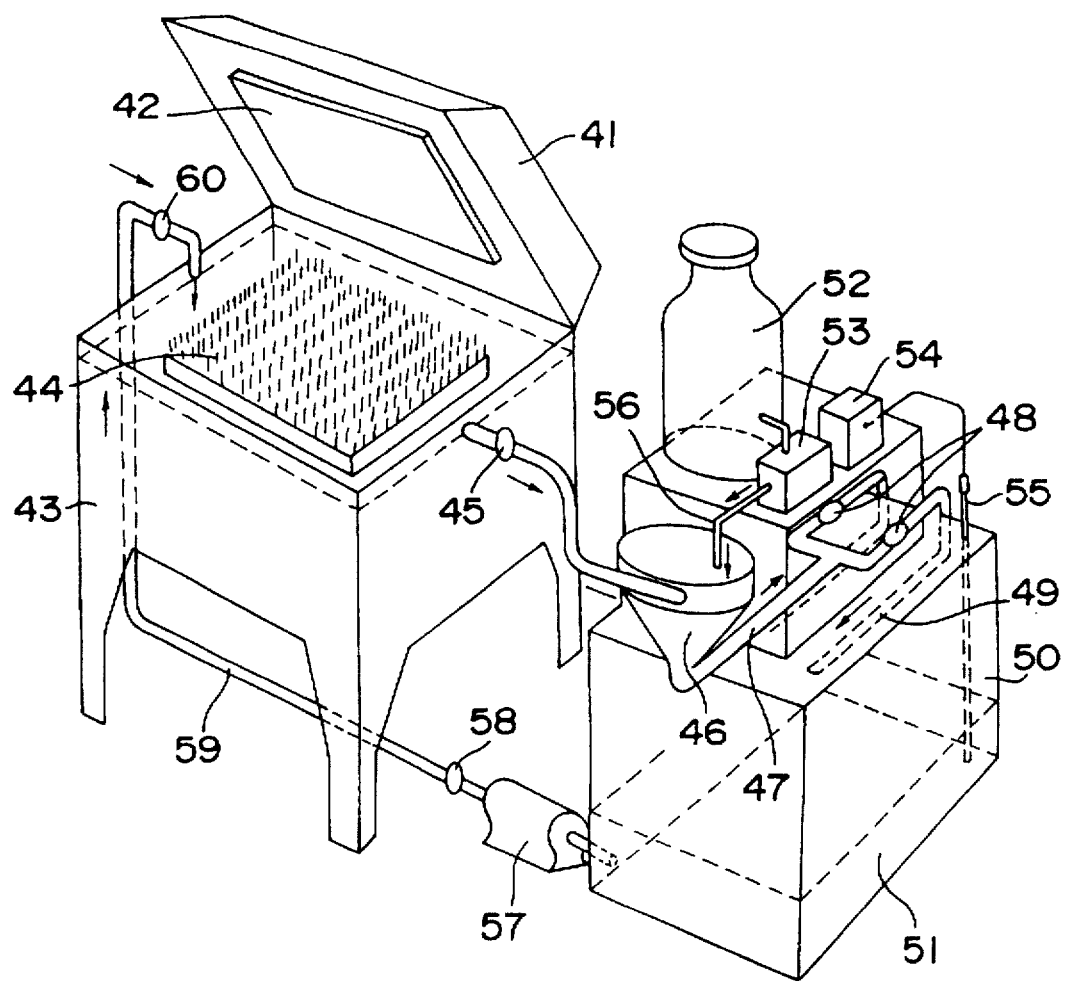
FIG. 13 is a schematic perspective view showing a flat plate type elution apparatus as a detailed apparatus of the apparatus shown in FIG. 12.

A conventional flexographic printing plate-making apparatus (elution apparatus) is provided with only pipes [pipes are installed on an outlet (a portion on which a flow rate-adjusting valve 45 has been installed) of overflowed water and an inlet (a portion on which a flow rate-adjusting valve 60 has been installed) of water to be recycled], as shown in FIG. 12. Reference numeral 41 denotes a cover; 42 denotes a flexographic printing plate installed on the cover 41; 43 denotes the main body of the elution apparatus; and 44 denotes a brush. Reference numerals 45, 48, 58, and 60 each denote a flow rate adjusting valve; 46 denotes a hopper; 47 denotes a slurry feeding pipe; 49 denotes a slurry discharge pipe; 50 denotes the main body of a filtering device; 51 denotes a filtrate tank; 52 denotes a flocculating agent tank; 53 denotes a flocculating agent feeding/metering pump; 54 denotes an automatic controller (controller for drive of metering pump) for connecting a pH meter; 55 denotes the pH meter; 56 denotes a flocculating agent feeding tube; 57 denotes a purified liquid-feed back pump; and 59 denotes a purified liquid-returning pipe. Thus, when the cover 41 is closed, resin to be eluted (unexposed portion) to aqueous medium is eluted by the brush 44 from the flexographic printing plate 42, and the resin is dispersed in the developer. The developer is guided to the hopper 46 serving as a flocculating unit.

Figure 14:
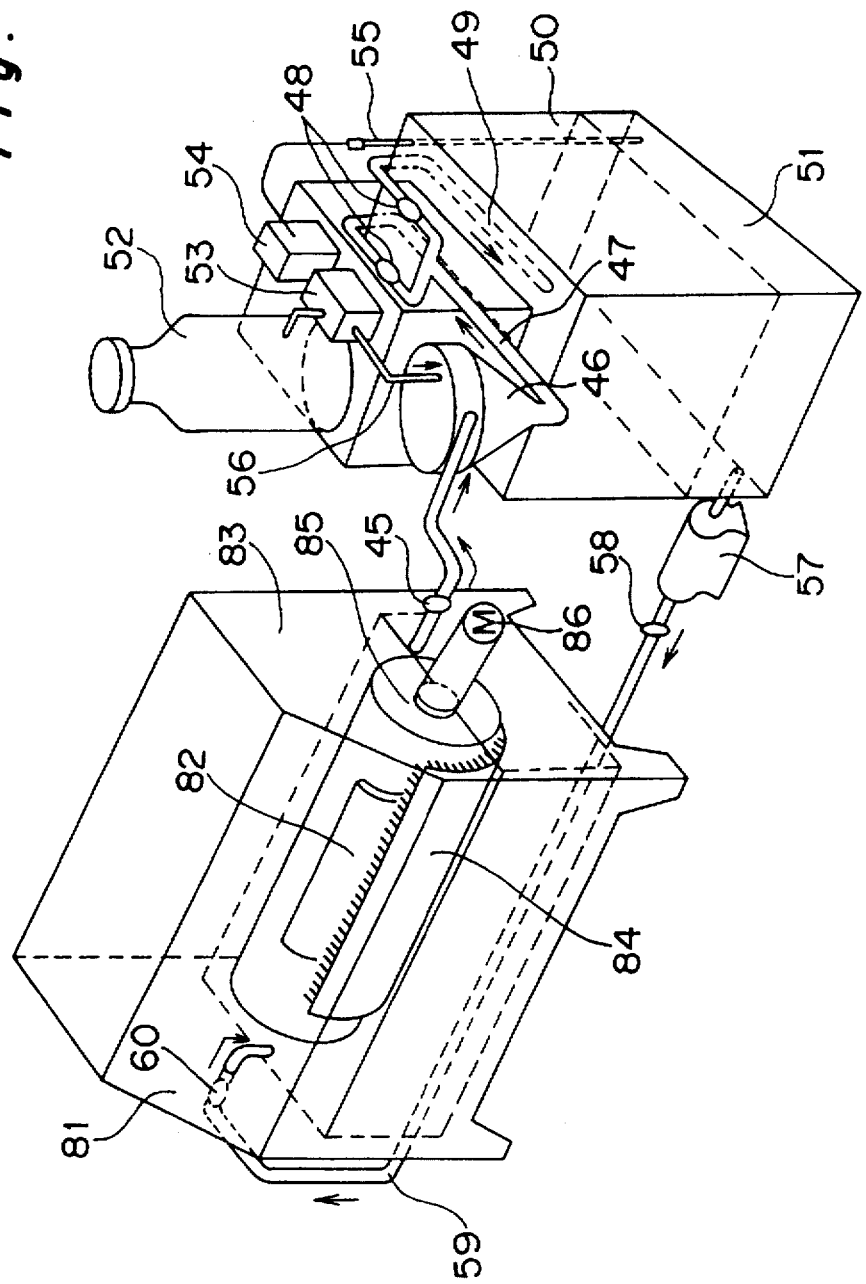
FIG. 14 is a schematic perspective view showing a cylindrical type elution apparatus as a detailed apparatus of the apparatus shown in FIG. 12.

In addition to the flat plate type, the conventional flexographic printing plate-making apparatus includes a cylindrical type (FIG. 14 shows a connection view showing the cylindrical type elution apparatus) for allowing a printing plate to be installed on a cylinder so as to develop the printing plate, a one-way automatic processor for making plates automatically and continuously, and a one-way semi-automatic processor for making plates semi-automatically and continuously, other than a flat plate type shown in FIG. 12. These apparatuses are applicable to the fourth embodiment.

Flocculation Unit

The fourth embodiment is characterized in the flocculating unit.

Figure 15:
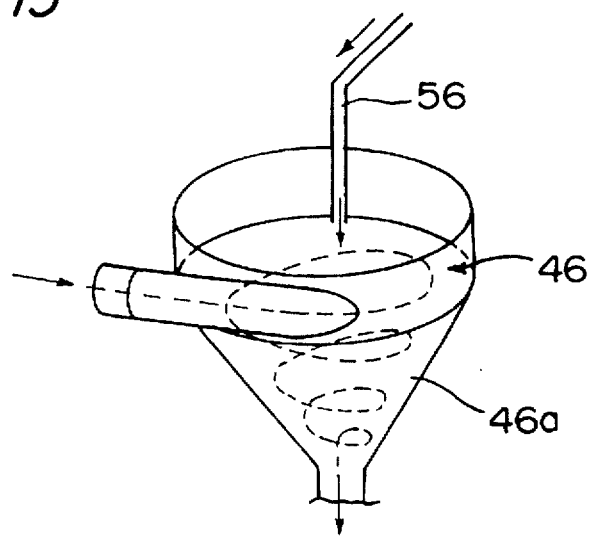
FIG. 15 is a schematic perspective view showing a hopper of each of the apparatuses shown in FIGS. 13 and 14.

As shown in FIG. 15, the developer is introduced into the hopper 46 having a cone portion 46a disposed at a lower portion thereof, the rotary water flow is generated in the cone portion 46a, the mixture of the flocculating agent is accelerated by the drip of the developer from the flocculating agent feeding tube 56 disposed at an upper portion of the hopper 46. In this manner, the solid content is uniformly flocculated. Preferably, the introduction of the developer from the elution tank 43 to the hopper 46 is accomplished through gravity drop by overflow supply. But if it is difficult to drop the developer by gravity due to the height relationship between the water surface of the elution tank and the inlet of the hopper 46, the developer may be supplied by a pump. The developer in which the solid content has been flocculated is introduced into the filtering device serving as a solid content/liquid separating unit via the slurry feeding pipe 47. The slurry-feeding pipe 47 is branched into two pipes in an downstream side thereof, and each branch pipe is provided with the flow rate adjusting valve 48, and a filter 61 is disposed on a downstream side of the flow rate adjusting valve 48. This is to allow one filter 61 to perform its operation while the other filter 61 is being replaced, by closing one of the valves 48.

Because the flocculating unit formed of a hopper having the cone portion, the solid content is uniformly (proper grain size range) dispersed in the slurry and in addition, short pass, namely, the passage of the liquid on only the surface of the slurry does not occur. As a result, the clogging of the filtering material becomes less and favorable filtering efficiency can be held. Further, since the rotary flow is generated and thus a turbulent state is generated, the solid content adheres to the wall surface of the flocculating unit and pipes in a small extent, which enables the operation of the apparatus for a long time and facilitates the maintenance thereof.

The kind of the flocculating agent to be used in the fourth embodiment is as follows: As flocculating agents to be used in the flocculating process, conventional inorganic and organic (polymer) flocculating agents used in the treatment of waste water can be used. For example, as the inorganic flocculating agents, aluminum salt (aluminum sulfate, sodium aluminate, polyvinyl aluminum (PAC)); and iron salt (iron sulfate (II), iron chloride (III), iron sulfate (III), chlorinated copparas) are used. As organic high polymer flocculating agents, anionic polymer (sodium alginate, CMC sodium salt, sodium polyacrylate, partially hydrolyzed salt of polyacrylamide, copolymer of maleic acid, cationic polymer (water-soluble aniline resin, polythionic urea, polyethylene imine, acrylic polymer having quaternary ammonium salt in side chain, polyvinyl pyridines), nonionic polymer (polyacrylamide, polyoxyethylene, caustic starch). Of the above, in adjusting the pH of the liquid to be treated, the inorganic flocculating agent which water solution is acid is favorable and in particular, aluminum salt having property of not coloring the filtrate is favorable.

Different according to the kind of flocculating agent, favorably, the flocculating agent is injected to the developer by the metering pump 53 in a range of 5 through 5000 ppm, and more favorably, 20 through 1000 ppm. Favorably, a grain size appropriate for the filtration/separation in the fourth embodiment is approximately 20 microns through 5 mm and more favorably, it is adjusted to 0.1 mm or more so as to improve the filtering efficiency in the filtering method utilizing gravity drop.

Solid/Liquid Separation Unit

Figure 16:
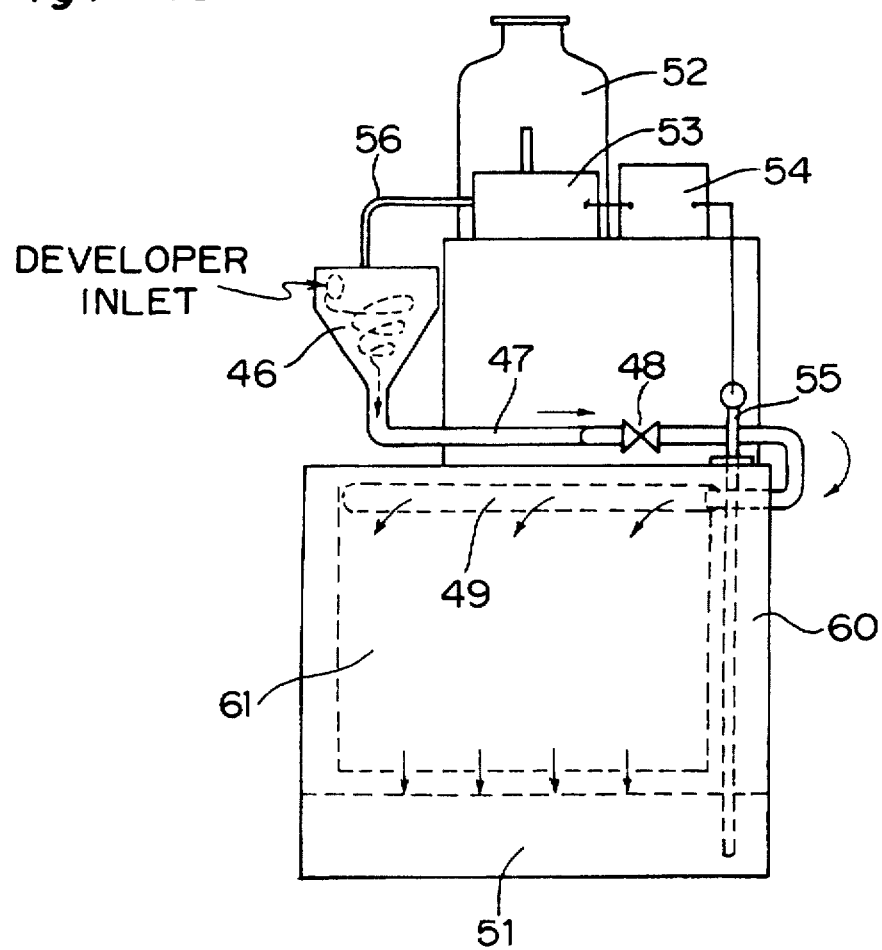
FIG. 16 is a front view showing a flocculating/filtering portion of each of the apparatuses shown in FIGS. 13 and 14.
Figure 17:
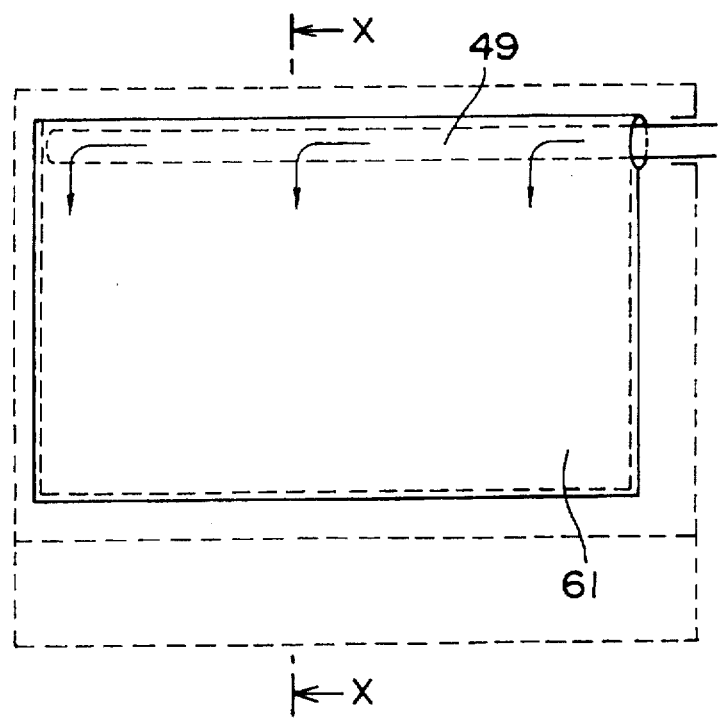
FIG. 17 is a front view showing a filter of each of the apparatuses shown in FIGS. 13 and 14.
Figure 18:
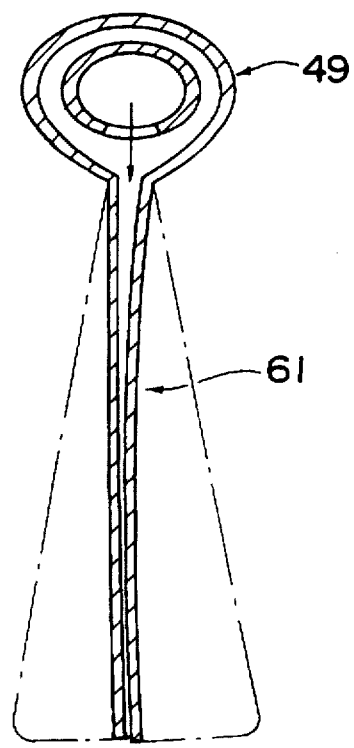
FIG. 18 is a sectional view, showing the filter of FIG. 17, taken along a line X—X of FIG. 17.
Figure 19:
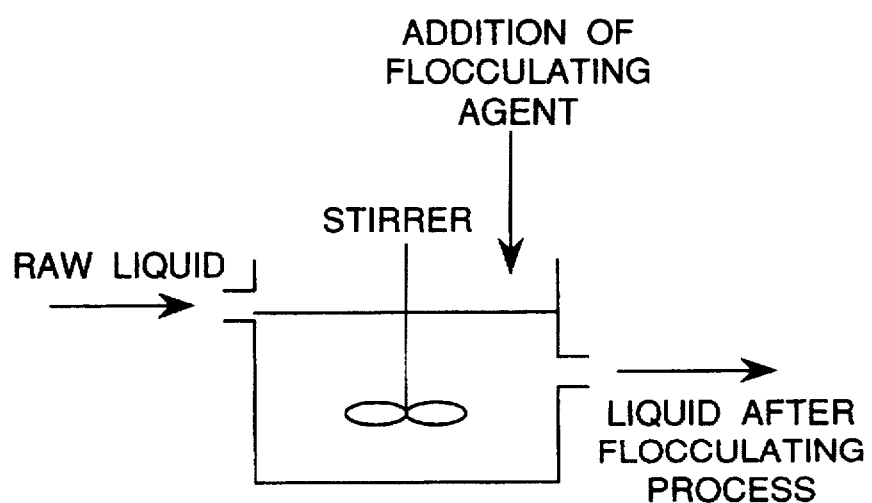
FIG. 19 is a schematic construction view showing a conventional flocculation tank.

As shown in FIGS. 16 through 18, a rectangular bag filter 61 formed by folding a piece of cloth double and sewing three sides together except the folded portion is prepared, and a slurry discharge pipe 49 is inserted into the bag-shaped folded portion of the filter 61. Preferably, the material of the filter 61 is cloth made of rayon, polyester, polypropylene, or nylon. Screen gauze (made of nylon, tetron, silk, or stainless) conventionally used in screen printing may be processed to use it as material of the filter 61. Favorably, the average diameter of the hole of the filter is 3 through 500 microns, and more favorably, 20 through 200 microns to prevent the filter from clogging, improve dehydration performance, and improve the efficiency of collecting the solid content. Desirably, the filtering area of the filter 61 is great. Depending on the kind of slurry and filter, as a criterion, favorably, the supply amount (load) of slurry per area (1 $cm^2$) of filter is 0.05 through 10 milliliters/$cm^2$ per time (one minute), and more favorably, 0.1 through 5 milliliters/$cm^2$ to prevent the filter from clogging and keep filtering efficiency.

The above-described strong acidic cation exchange resin is favorably put into the bag filter 61 beforehand to facilitate the filtration of the flocculated solid content and a pH control in absorbing/collecting basic nitrogen-contained compound which has dissolved in water. In this case, it is possible to use flocculating agent such as high molecular flocculating agent having no pH-adjusting function. In addition, since the strong acidic cation exchange resin is put into the bag filter 61, it can be collected together with the resin solid content after the use and thus it can be handled easily.

pH-adjusting Unit

Filtrate which has dripped from the filter 61 is stored in the filtrate tank 51. As shown in FIG. 12, the pH value of the filtrate in the filtrate tank 51 is measured by the holder-provided pH meter 55 (a sensor is disposed at leading end thereof); a signal indicating a measured value is converted by an automatic controller 54 controlled by a microcomputer; and a switch or the stroke length of the flocculating agent feeding/metering pump 53 is automatically controlled. In this manner, a liquid feeding amount is controlled. The filtrate in the filtrate tank 51 is supplied to the developing tank 4 by the purified liquid-feedback pump 57.

EXAMPLE
(Preparation of Plate Made of Photosensitive Resin)

Tests approximately similar to the examples made on those according to the above-described embodiments were conducted by using the apparatus (FIG. 14) according to the fourth embodiment. The examples of the fourth embodiment are different from those the above-described embodiment in that 1% water solution of sulfuric acid was used as flocculating agent. Referring to FIG. 14, 81 denotes a cover; 82 denotes a fitted flexographic printing plate; 83 denotes the main body of the elution apparatus; 84 denotes a brush; 85 denotes a plate-fitted drum; and 86 denotes a drum-driving motor. Table 3 shows comparison data obtained in a case in which a conventional flocculating tank was used; in a case in which the flocculating device according to the fourth embodiment was used; and in a case in which no flocculating device was used.

TABLE 3

| [Common condition] | | | |
|---|---|---|---|
| size of plate to to be developed (number of plates) | developing time period | capacity of developing tank | recycling flow rate |
| A2 size (10 plates) | 50 minutes (5 minutes/ plate) | 50 liters | 5 liters/min |

Addition amount of flocculating agent: 30 ppm (average value);
Adjusted pH: 7.5
Surface area of bag filter: 8,500 $cm^2$ (average hole diameter: 35μ)

[Experimental result]

| flocculating unit | soil of unit pipe after operation | filtering performance of filtering material |
|---|---|---|
| hopper (fourth embodiment) | not polluted much | not clogged |
| flocculating tank (conventional) | polluted much | clogged much |
| flocculating device not provided | — | clogged much more impossible to filter in 15 minutes |

Figure 20:
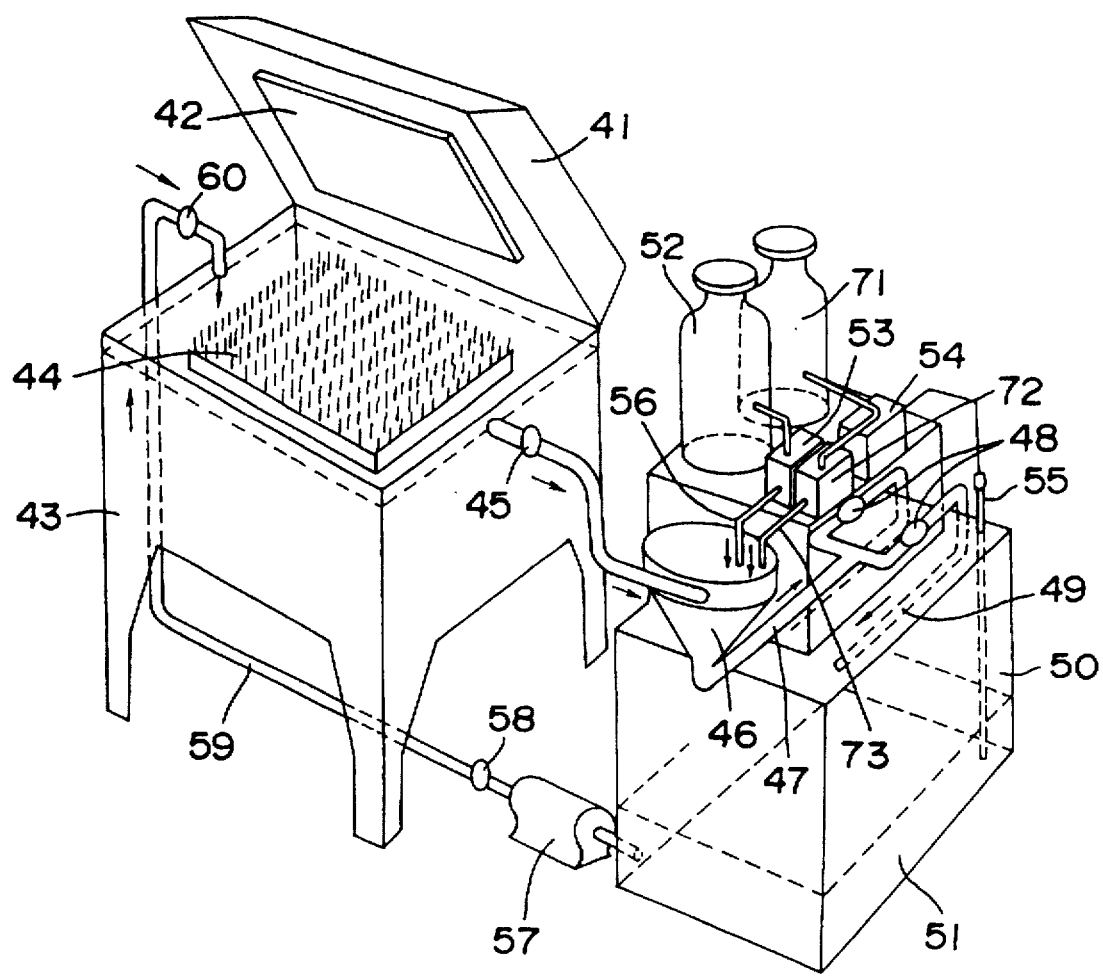
FIG. 20 is a view showing a schematic construction of an apparatus according to a fifth embodiment of the present invention.

In the fourth embodiment, the pH of the filtrate in the filtrate tank 11 was measured and then, the flocculating agent (acidic flocculating agent) having the above-described pH-adjusting function was supplied into the hopper 46 serving as the flocculating tank. When flocculating agent such as high molecular flocculating agent having no pH-adjusting function is used, pH-adjustor can be provided in addition to the flocculating agent as a fifth embodiment, as shown in FIG. 20 so as to supply the pH-adjustor into the filtrate tank 51 from a pH-adjustor (acid) tank 71 via a pH-adjustor feeding tube 73, by controlling a pH-adjustor feeding/metering pump 72 based on a signal outputted from a pH meter 55 according to the pH of the filtrate tank 11.

We claim:

1. A method of circulating a developer used for developing a printing plate coated with a photosensitive resin composition having a specific gravity of less than 1 and containing a water-dispersion resin component therein, which method comprises:

developing said coated printing plate in an aqueous developing liquid in a developing tank to remove an unexposed portion of the photosensitive resin composition from the printing plate, a portion of said photosensitive resin having been previously exposed to light, whereby grains of resin in the unexposed photosensitive resin composition are dispersed into the aqueous developing liquid;

transferring the aqueous developing liquid containing said dispersed resin grains horizontally from said developing tank into a hopper having a cone portion at a lower portion thereof so as to generate a rotary flow and flocculating said dispersed resin grains by dripping a flocculating agent from an upper portion of said hopper, adjusting the aqueous developing liquid in the flocculating tank to a pH of between 5.5 and 8.5;

transferring the aqueous developing liquid containing the flocculated resin grains from said hopper into a solid content/liquid content separation device composed of a bag filter in which the average diameter of each hole of the bag filter is 3 through 500 microns, whereby a solid content is separated from a liquid content and wherein the supply amount of aqueous developing liquid per $cm^2$ of the filter is 0.05 through 20 millimeters per minute; and removing the solid content and recycling the liquid content back to the developing tank, said photosensitive resin composition comprising (a) a three-dimensional bridged grain polymer microgel having a diameter of 0.01 through 5µ obtained by polymerizing mixture of an aliphatic conjugate diene monomer and a monofunctional ethylenically unsaturated monomer and/or multi-functional ethylenically unsaturated monomer, (b) a hydrophobic elastomer having a molecular weight of 5,000 through 1,000,000 and containing at least 30% mole of a conjugate diene monomer unit per molecular in the compound; (c) a compound containing basic nitrogen atoms, (d) a photopolymerization ethylenically unsaturated monomer, and (e) a photo-polymerization initiator.

2. A method of circulating a developer used for developing a printing plate coated with a photosensitive resin composition having a specific gravity of less than 1 and containing a water-dispersion resin component therein, which method comprises:

developing said coated printing plate in an aqueous developing liquid in a developing tank to remove an unexposed portion of the photosensitive resin composition from the printing plate, a portion of said photosensitive resin composition having been previously exposed to light, whereby grains of resin in the unexposed photosensitive resin composition are dispersed into said aqueous developing liquid;

transferring the aqueous developing liquid containing said dispersed resin grains horizontally from said developing tank into a hopper having a cone portion at a lower portion thereof so as to generate a rotary flow and flocculating said dispersed resin grains by dripping a flocculating agent from an upper portion of said hopper;

transferring the aqueous developing liquid containing the flocculated resin grains from said hopper into a solid content/liquid content separation device composed of a bag filter in which the average diameter of each hole of the bag filter is 3 through 500 microns, whereby a solid content is separated from a liquid content and wherein the supply amount of aqueous developing liquid per $cm^2$ of the filter is 0.05 through 20 millimeters per minute;

removing the solid content; and transferring the separated liquid content to a pH adjusting tank wherein the separated liquid content is adjusted to a pH of between 5.5 and 8.5, and recycling the pH-adjusted liquid content back to the developing tank, said photosensitive resin composition comprising (a) a three-dimensional bridged grain polymer microgel having a diameter of 0.01 through 5µ obtained by polymerizing mixture of an aliphatic conjugate diene monomer and a monofunctional ethylenically unsaturated monomer and/or multi-functional ethylenically unsaturated monomer, (b) a hydrophobic elastomer having a molecular weight of 5,000 through 1,000,000 and containing at least 30% mole of a conjugate diene monomer unit per molecular in the compound, (c) a compound containing basic nitrogen atoms, (d) a photo polymerization ethylenically unsaturated monomer, and (e) a photo polymerization initiator.

3. A method for circulating a developer used for developing a printing plate coated with a photosensitive resin composition having a specific gravity of less than 1 and containing a water-dispersion resin component therein, which method comprises:

developing said coated printing plate in an aqueous developing liquid in a developing tank to remove an unexposed portion of the photosensitive resin composition therefrom, whereby grains of resin in the unexposed photosensitive resin composition are dispersed into said aqueous developing liquid;

directing said aqueous developing liquid containing said grains of resin dispersed therein into a solid content/liquid content separation device composed of a bag filter to separate a solid content from a liquid content;

discharging said solid content and directing said liquid content into a pH adjusting device wherein pH of said liquid content is adjusted; and recycling the pH adjusted liquid content back to the developing tank.

4. A method according to claim 1 or 2 wherein the aqueous developing liquid containing the flocculated resin grains in the hopper is transferred to a solid content concentration tank interposed between the hopper tank and the solid content/liquid content separation device, and is allowed to stand therein so that the flocculated resin grains float on the surface of the aqueous developing liquid before being discharged to the solid content/liquid content separation device.

5. A method according to claims 1, 2 or 3 wherein the average diameter of the holes of the bag filter is 20 through 200 microns and the supply amount of the aqueous liquid containing the flocculated resin grains per 1 $cm^2$ of the bag filter is 0.1 through 5 millimeters/$cm^2$.

6. A method according to claims 1, 2 or 3 wherein the aqueous developing liquid containing the dispersed resin grains is transferred into the bag filter through two pipes provided with flow rate adjusting valves to permit the flow rate of said developing liquid to be adjusted in each pipe.

7. A developer-circulating apparatus for use in aqueous development of a printing plate coated with a photosensitive resin composition having a specific gravity of less than 1 and containing a water-dispersion resin component therein, said apparatus comprising:

a developing tank for developing said printing plate wherein a portion of photosensitive resin has been previously exposed to light, and wherein a portion of the photosensitive resin composition thereon, which has been unexposed to light, is removed with an aqueous liquid developer, whereby grains of resin in the unexposed photosensitive resin composition are dispersed into said aqueous liquid developer;

a hopper having a cone portion at a lower portion thereof connected to said developing tank for receiving said aqueous liquid developer containing said grains of resin, wherein said grains of resin are flocculated, said hopper providing means for adjusting pH of the aqueous liquid developer;

a solid content/liquid content separation device composed of a bag filter in which the average diameter of each hole of the bag filter is 3 through 500 microns, said bag filter being connected to said hopper for separating a solid content from a liquid content; and means for recycling the liquid content back to the developing tank.

8. A developer-circulating apparatus for use in aqueous development of a printing plate coated with a photosensitive resin composition having a specific gravity of less than 1 and containing a water-dispersion resin component therein, said apparatus comprising:

a developing tank for developing said printing plate wherein a portion of the photosensitive resin composition has been previously exposed to light, and wherein a portion of the photosensitive resin composition, which has been unexposed to light, is removed with an aqueous liquid developer, whereby grains of resin in the unexposed photosensitive resin composition are dispersed into said aqueous liquid developer;

a hopper having a cone portion at a lower end thereof so as to generate a rotary flow, said hopper connected to said developing tank for receiving said aqueous liquid developer containing said grains of resin, wherein said grains of resin are flocculated;

a solid content/liquid content separation device composed of a bag filter, in which the average diameter of each hole of the bag filter is 3 through 500 microns, which is connected to said hopper for separating a solid content from a liquid content;

a pH adjusting tank disposed between the solid content/liquid content separation device and the developing tank wherein pH of the liquid content is adjusted before being recycled back to the developing tank; and means for recycling the liquid content back to the developing tank.

9. A developer-circulating apparatus according to claim 7 or 8 which further comprises a solid content concentration tank interposed between the hopper and the solid content/liquid content separation device for allowing the aqueous developing liquid containing the flocculated resin grains to stand so that the flocculated resin grains float on the surface of the aqueous developing liquid before being discharged into the solid content/liquid content separation device.

10. A developer-containing apparatus according to claim 7 or 8, wherein the developer from the developing tank is supplied into an upper side of the cone portion of the hopper so as to generate a rotary water flow in a peripheral direction of the hopper while the flocculating agent is dripped into the rotary water flow, and then the water flow is discharged through a lower end of the cone portion of the hopper.

11. A developer circulating apparatus according to claims 7 or 8 in which the average diameter of the holes of the bag filter is 20 through 200 microns.

12. A developer-circulating apparatus for use in aqueous development of a printing plate coated with a photosensitive resin composition having a specific gravity of less than 1 and containing a water-dispersion resin component therein, said apparatus comprising:

a developing tank for developing a printing plate wherein a portion of said photosensitive resin composition unexposed to light is removed with an aqueous liquid developer, whereby grains of resin in the unexposed photosensitive resin composition are dispersed into said aqueous liquid developer;

a solid content/liquid content separation device composed of a bag filter connected to said developing tank to separate a solid content from a liquid content;

a pH adjusting tank connected to said solid content/liquid content separation device to adjust pH of the separated liquid content; and means for recycling the liquid content back to the developing tank.

* * * * *